(12) United States Patent
Takeuchi et al.

(10) Patent No.: US 6,772,492 B2
(45) Date of Patent: Aug. 10, 2004

(54) PIEZO-ELECTRIC/ELECTROSTRICTIVE DEVICE AND METHOD OF MANUFACTURING

(75) Inventors: Yukihisa Takeuchi, Nishikamo-Gun (JP); Kazuyoshi Shibata, Mizunami (JP); Koji Ikeda, Kounan (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/211,872

(22) Filed: Aug. 2, 2002

(65) Prior Publication Data

US 2002/0184744 A1 Dec. 12, 2002

Related U.S. Application Data

(60) Division of application No. 09/663,145, filed on Sep. 15, 2000, now Pat. No. 6,455,981, which is a continuation-in-part of application No. 09/501,162, filed on Feb. 9, 2000, now abandoned, and a continuation-in-part of application No. 09/524,042, filed on Mar. 13, 2000, now Pat. No. 6,498,419.
(60) Provisional application No. 60/218,191, filed on Jul. 14, 2000.

(30) Foreign Application Priority Data

| Oct. 1, 1999 | (JP) | 11-281522 |
| Oct. 28, 1999 | (JP) | 11-307844 |
| Nov. 16, 1999 | (JP) | 11-326195 |
| Dec. 27, 1999 | (JP) | 11-371967 |
| Jan. 21, 2000 | (JP) | 2000-013576 |
| Jan. 24, 2000 | (JP) | 2000-015123 |
| Mar. 1, 2000 | (JP) | 2000-056434 |
| Jun. 16, 2000 | (JP) | 2000-182354 |

(51) Int. Cl.$^7$ .......... H04R 17/00; H01L 41/04; H01L 41/08; H01L 41/18
(52) U.S. Cl. .......... 29/25.35; 29/830; 310/324
(58) Field of Search .......... 310/324, 328, 310/330, 331, 332; 29/25.35, 830; 264/605; 156/89.12, 89.16, 252

(56) References Cited

U.S. PATENT DOCUMENTS 2,980,811 A 4/1961 Jacque (List continued on next page.)

FOREIGN PATENT DOCUMENTS

| DE | 41 35 408 A1 | 4/1993 |
| JP | 61-150287 | 7/1986 |

(List continued on next page.)

OTHER PUBLICATIONS

U.S. patent application Ser. No. 10/237,495, Ikeda et al., filed Sep. 9, 2002.

(List continued on next page.)

*Primary Examiner*—Carl J. Arbes
*Assistant Examiner*—Tai Nguyen
(74) *Attorney, Agent, or Firm*—Burr & Brown

(57) ABSTRACT

The present invention provides a piezo-electric/electrostrictive device including a pair of thin plate sections in an opposed relation to each other, a fixing section for supporting the thin plate sections, and at least one pair of piezo-electric/electrostrictive elements are provided to the pair of thin plate sections. The thin plate sections include movable sections having end surfaces in an opposed relation. Recesses between the thin plate sections are filled with a filler are formed at the boundaries between the thin plate sections, and the fixing section and the movable sections. As a result, the impact resistance of the device is enhanced. The present invention also relates to a method for producing such a device.

8 Claims, 12 Drawing Sheets

U.S. PATENT DOCUMENTS

| | | | | |
|---|---|---|---|---|
| 4,680,595 A | * | 7/1987 | Cruz-Uribe et al. | 347/40 |
| 4,806,295 A | * | 2/1989 | Trickett et al. | 156/89.22 |
| 5,481,152 A | | 1/1996 | Buschulte | |
| 5,774,961 A | * | 7/1998 | Takeuchi et al. | 29/25.35 |
| 5,804,906 A | | 9/1998 | Tsutsumi | |
| 5,828,157 A | | 10/1998 | Miki et al. | |
| 5,860,202 A | * | 1/1999 | Okawa et al. | 29/25.35 |
| 5,956,829 A | * | 9/1999 | Kitahara et al. | 29/25.35 |
| 6,262,516 B1 | | 7/2001 | Fukuda et al. | |
| 2002/0017830 A1 | | 2/2002 | Ikeda et al. | |

FOREIGN PATENT DOCUMENTS

| | | |
|---|---|---|
| JP | 63-064640 | 3/1988 |
| JP | 10-136665 | 5/1998 |

OTHER PUBLICATIONS

U.S. patent application Ser. No. 09/671,587, Takeuchi et al., filed Sep. 27, 2000.

U.S. patent application Ser. No. 10/106,141, Takeuchi et al., filed Mar. 26, 2002.

Soeno et al., *Piezoelectric Piggy–Back Microactuator for Hard Disk Drive*, IEEE Transactions on Magnetics, vol. 35, No. 2, Mar. 1999.

Koganezawa et al., *Dual–Stage Actuator System for Magnetic Disk Drives Using a Shear Mode Piezoelectric Microactuator*, IEEE Transactions on Magnetics, vol. 35, No. 2, Mar. 1999.

* cited by examiner

PIEZO-ELECTRIC/ELECTROSTRICTIVE DEVICE AND METHOD OF MANUFACTURING

CROSS REFERENCE TO RELATED APPLICATIONS

This application is a division of U.S. application Ser. No. 09/663,145 filed Sep. 15, 2000, now U.S. Pat. No. 6,455,981 which in turn is a continuation-in-part of U.S. application Ser. No. 09/501,162 filed Feb. 9, 2000 now abandoned and U.S. application Ser. No. 09/524,042 filed Mar. 13, 2000, now U.S. Pat. No. 6,498,419 and which claims the benefit of U.S. Provisional Application Serial No. 60/218,191 filed Jul. 14, 2000, the entireties of which are incorporated herein by reference.

FIELD OF THE INVENTION

The present invention relates to a piezo-electric/electrostrictive device including movable sections which operate based on the displacement movement of a piezo-electric/electrostrictive element, a piezo-electric/electrostrictive device in which the displacement of the movable sections can be detected by a piezo-electric/electrostrictive element, and a method for producing the same. Specifically, the present invention relates to a piezo-electric/electrostrictive device having high strength, high impact resistance, and high moisture resistance in which movable sections can be operated in a large movement efficiently, and a method for producing the same.

BACKGROUND OF THE INVENTION

Recently, in the field of optics, magnetic recording, and precision processing, there is a demand for a displacement element capable of adjusting the length and position of an optical path by orders of submicron. In an attempt to satisfy such a demand, developments have been pursued for a displacement element which utilizes a displacement generated by an inverse piezo-electric effect and an electrostrictive effect obtained when a voltage is applied to a piezo-electric/electrostrictive material (for example, ferroelectric substances and the like).

As a conventional displacement element such as described above, Japanese Unexamined Patent Publication No. 10-136665 discloses a piezo-electric actuator having a structure where a piezo-electric/electrostrictive material is formed into a plate-like body which is then perforated, thereby integrally forming a fixing section, movable sections, and a beam section for supporting them into one-piece unit, and an electrode layer is formed in the beam section. In this piezo-electric/electrostrictive actuator, when a voltage is applied to the electrode layer, the beam section shrinks in a direction that connects the fixing section to the movable sections due to the inverse piezo-electric effect and electrostrictive effect. As a result, the movable sections can be displaced along an arc or rotatively displaced within the surface of the plate-like body.

Japanese Unexamined Patent Publication No. 63-64640 discloses a technique using an actuator with a bimorph. The electrode of the bimorph is divided into a plurality of electrodes, and the divided electrodes are selectively driven. In this manner, positioning can be performed with high accuracy at high speed. This prior art publication shows (in particular, in FIG. 4) the structure where two bimorphs are positioned in an opposed relation to each other.

However, the conventional actuators described above are entirely constituted by fragile materials which are relatively heavy in weight. Therefore, they have low mechanical strength, and are poor in handling characteristics and impact resistance.

Conventionally, in an attempt to improve the mechanical strength of the conventional actuators, the strength of the section easy to vibrate has been enhanced. For this purpose, the enhancement in the rigidity of the vibration section has been conducted. The enhancement adversely affects the basic properties of the actuator itself, such as resonance characteristics and displacement, and causes a problem in that the adjustment of the basic properties becomes difficult.

SUMMARY OF THE INVENTION

The present invention has been made in order to improve the impact resistance of the force sensor described in Japanese Patent Applications Nos. 11-114669, 11-259006, and 11-259007 which are prior applications filed by the present inventors. Furthermore, the present invention has been made based on the finding that, in the force sensor described in the U.S. patent application No. 09/501,162 which utilized a piezo-electric body, the impact exerted to the operating body from the outside is easily adsorbed by a viscoelastic body provided into a narrow slot formed under the supporting bed, thereby improving the impact resistance of the vibration plate.

In order to enhance the impact resistance of the device, while giving only a small influence on the basic properties of the device itself, according to the present invention, a piezo-electric/electrostrictive device includes a pair of thin plate sections in an opposed relation to each other, a fixing section for supporting the thin plate sections, the pair of thin plate sections having a movable section at a top end thereof, and at least one of the pair of thin plate sections having one or more piezo-electric/electrostrictive elements, wherein a filler is provided in recesses between the thin plate sections and the movable sections, or in recesses between the thin plate sections and the fixing section. With this arrangement, even if the thin plate sections produce large displacements by receiving a large impact from the outside, the stress generated at the boundary between the thin plate sections and the movable sections or between the thin plate sections and the fixing section is dispersed into the filler provided in the recess. In this manner, there is no damage of the device which has been conventionally resulted from the concentration of the stress, and the impact resistance of the thin plate sections is enhanced.

In the present invention, the concept of the piezo-electric/electrostrictive device resides in that electrical energy and mechanical energy are alternately converted by a piezo-electric/electrostrictive element included therein. Therefore, the piezo-electric/electrostrictive device is most preferably used as an active device, such as various actuators and vibrators, and especially a displacement device which utilizes a displacement created by a backward voltage effect and electrostrictive effect. In addition, the piezo-electric/electrostrictive device is also preferable as a passive device such as acceleration sensor elements and impact sensor elements.

As a material for the filler, an organic resin, such as an adhesive, glass, a mixture of an organic resin and ceramics, metal, or a mixture of metal and ceramics may be used. The filler may be porous or dense. It is preferable that the filler is highly porous as its hardness increases, and is highly dense as its flexibility increases. The filler layer is preferably adhered to the thin plate section, and the movable section, the fixing section, and the filler layer itself have elasticity or flexibility. Furthermore, the filler itself is preferably a viscoelastic body, because a filler with viscoelasticity effectively adsorbs the impact from the outside.

The recess into which the filler is provided has a shape of rectangle. Alternatively, the surface of the recess formed by the inner surface of the movable section or fixing section in an opposed relation to the thin plate section may be in a step-like or tapered shape. When the device is produced by laminating green sheets, the recess may be formed by a single layer or multiple layers. When the recess is formed by a single layer, the preferable thickness of the recess is 0.01 to 0.3 mm, and the preferable depth thereof is 0.03 to 1 mm. The preferable ratio of thickness to depth (thickness/depth) is 0.01 to 10, and more preferably 0.1 to 3. When the recess is formed by multiple layers, the thickness of the recess is preferably increased in the longitudinal direction of the thin plate section.

The thickness of the recess indicates the length of the shortest portion in the recess. The recess does not necessarily have a uniform size, but its opening or bottom may have a larger size.

Preferably, a method for producing a piezo-electric/electrostrictive device including a pair of thin plate sections in an opposed relation to each other, a fixing section for supporting the thin plate sections, the pair of thin plate sections having a movable section at a top end thereof, and at least one of the pair of thin plate sections having one or more piezo-electric/electrostrictive elements, includes the steps of forming and preparing a first ceramic green sheet to be the thin plate section, a second ceramic green sheet having a first window section, and a third ceramic green sheet having a window section smaller than the first window section, and interposing at least the second ceramic green sheet between the first and third ceramic green sheets to prepare a laminated body of a plurality of ceramic green sheets.

It is also preferable that a method for producing a piezo-electric/electrostrictive device including a pair of thin plate sections in an opposed relation to each other, a fixing section for supporting the thin plate sections, the pair of thin plate sections having a movable section at a top end thereof, and at least one of the pair of thin plate sections having one or more piezo-electric/electrostrictive elements, includes the steps of forming and preparing a first ceramic green sheet to be the thin plate section, and a second ceramic green sheet having a window section, and interposing a sheet containing a high-melting point metal between the first ceramic green sheet and the second ceramic green sheet.

In addition, it is preferable that the sheet containing the high-melting point metal is formed by a printing method.

DETAILED DESCRIPTION OF THE INVENTION

Hereinafter, embodiments in which the piezo-electric/electrostrictive device of the present invention is obtained will be described in detail.

Figure 1:
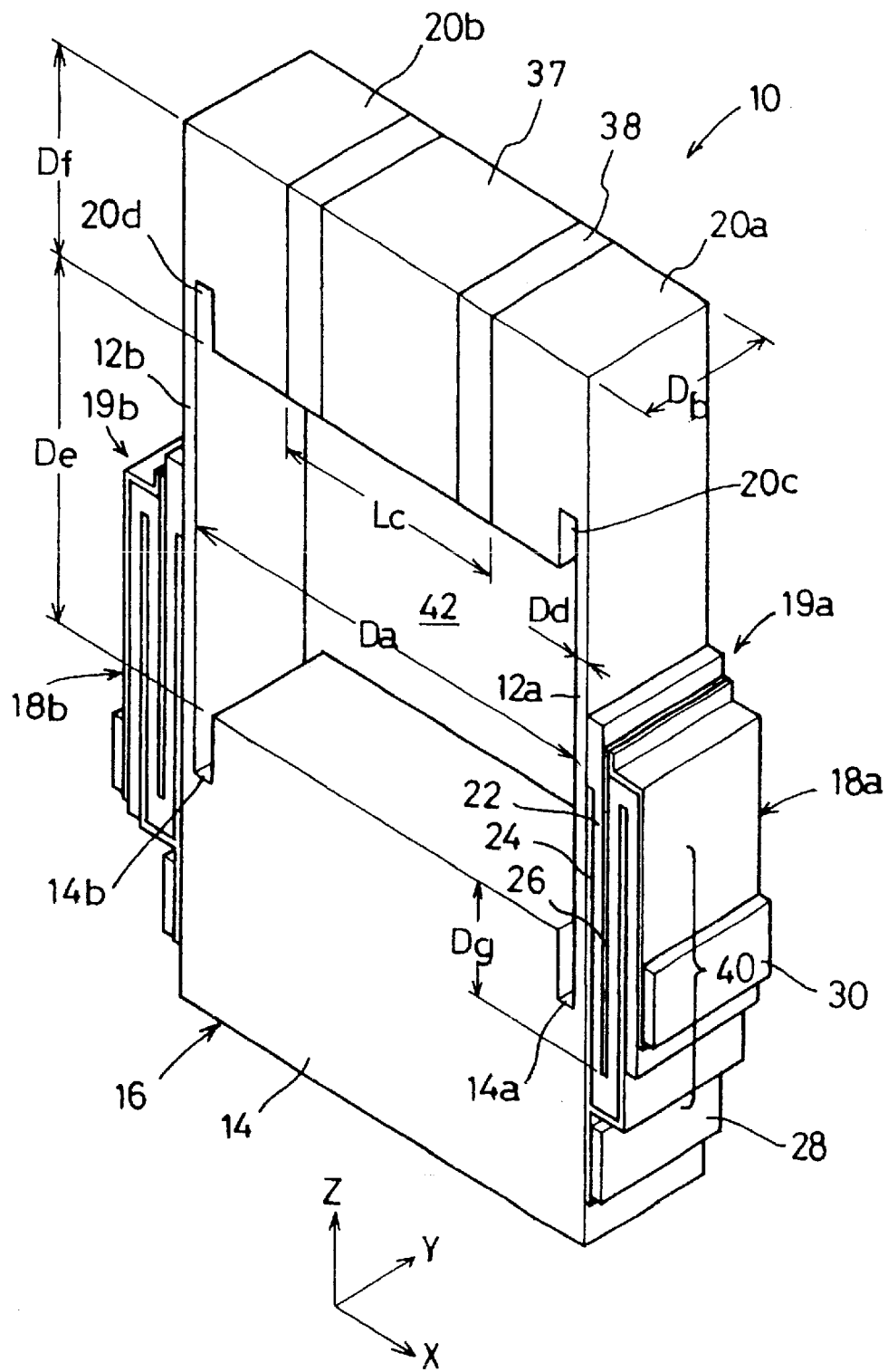
FIG. 1 is a perspective view showing a piezo-electric/electrostrictive device.

FIG. 1 is a perspective view showing a piezo-electric/electrostrictive device 10. The piezo-electric/electrostrictive device 10 has a substrate 16 in which a pair of thin plate sections 12a and 12b in an opposed relation to each other, and a fixing section 14 for holding the thin plate sections 12a and 12b are integrally formed. A part of the pair of thin plate sections 12a and 12b is respectively formed with piezo-electric/electrostrictive elements 18a and 18b.

In the piezo-electric/electrostrictive device 10, the pair of thin plate sections 12a and 12b are displaced by driving the piezo-electric/electrostrictive elements 18a and/or 18b, or the displacement of the pair of thin plate sections 12a and 12b is detected by the piezo-electric/electrostrictive elements 18a and/or 18b.

The top end of the respective thin plate sections 12a and 12b projects inwardly to be thick. The thick portions serve as movable sections 20a and 20b which are displaced in accordance with the displacement movement of the thin plate sections 12a and 12b. Hereinafter, the top ends of the thin plate sections 12a and 12b are referred to as movable sections 20a and 20b.

At the boundaries between the top ends of the thin plates 12a and 12b, and the movable sections 20a and 20b, respectively, recesses 20c and 20d are formed along a longitudinal direction of the thin plate sections 12a and 12b. In the respective recesses 20c and 20d, a filler is provided. Similarly, at the boundaries between the bottom ends of the thin plates 12a and 12b and the fixing section 14, recesses 14a and 14b are formed along a longitudinal direction of the thin plate sections 12a and 12b, respectively. In the recesses 14a and 14b, a filler is provided.

The substrate 16 may have a single structure made of ceramics alone, or alternatively, may have a hybrid structure made of ceramics and a metallic material in combination.

The substrate 16 also may have a structure in which the members thereof are attached to each other by an adhesive such as an organic resin and glass, a ceramic-integrated structure in which ceramic green sheets are laminated on top of each other and are sintered into one-piece unit, or a metal-integrated structure in which metallic members are integrated into one-piece unit by brazing, soldering, eutecting bonding, or welding. Preferably, the substrate 16 is formed with a ceramic laminated body produced by sintering ceramic green laminated body into a one-piece unit.

When the substrate has a ceramic-integrated structure, no adhesive is used at the connections between its members. Without the use of adhesive, the substrate undergoes almost no change of state with the elapse of time, and therefore, this structure is advantageous in that high reliability is attained at the connections between the members, and high rigidity is also attained. In addition, this structure can be easily produced by a ceramic green sheet laminating method which will be described later.

The piezo-electric/electrostrictive elements 18a and 18b are prepared independently from the substrate 16, as will be described later, and then are attached to the substrate 16 with an adhesive such as an organic resin and glass, or by a method such as brazing, soldering, eutectic bonding and the like. Alternatively, the piezo-electric/electrostrictive elements 18a and 18b are directly and integrally formed into the substrate 16 by a film forming method, instead of being attached to the substrate 16.

The piezo-electric/electrostrictive elements 18a and 18b respectively include a piezo-electric/electrostrictive layer 22, and a pair of electrodes 24 and 26 formed on both sides of the piezo-electric/electrostrictive layer 22. Among the pair of electrodes 24 and 26, at least the electrodes 24 are formed on the pair of thin plate sections 12a and 12b.

In one embodiment of the present invention, a description is mainly made to the case where the piezo-electric/electrostrictive elements 18a and 18b have the following structure. That is, the piezo-electric/electrostrictive layer 22, and the pair of electrodes 24 and 26 respectively have a multilayered structure. The electrodes 24 and the electrodes 26 are alternately laminated to each other in such a manner that the cross-section of the laminated electrodes 24 and 26 is substantially in the form of comb. The portion where the electrodes 24 and the electrodes 26 overlap each other in a state of interposing the piezo-electric/electrostrictive layer 22 therebetween has a multistage structure. However, the structure of the piezo-electric/electrostrictive layer 22 and the pair of electrodes 24 and 26 is not limited to the multilayered structure, but may be a single-layered structure. The number of the layers is not specifically limited, however, ten layers or smaller is preferable, and five layers or smaller is more preferable. In addition, only one of the piezo-electric/electrostrictive layers 18a or 18b may be formed. The number of the layers of the piezo-electric/electrostrictive layer 22, and the electrodes 24 and 26 may be different from each other.

FIG. 1 shows the case where the piezo-electric/electrostrictive layer 22 has a three-layered structure. The electrodes 24 is formed into a shape of comb so as to be positioned under the lower surface of the first layer of the piezo-electric/electrostrictive layer 22 (i.e., on the side surface of the thin plate sections 12a and 12b) and on the upper surface of the second layer thereof. The other electrodes 26 are formed into the shape of a comb so as to be positioned on the upper surface of the first layer of the piezo-electric/electrostrictive layer 22, and on the upper surface of the third layer thereof. In this structure, since the electrodes 24 and the other electrodes 26 are respectively connected to each other into common electrodes, the number of the terminals 28 and 30 can be decreased. In this manner, upsizing of the piezo-electric/electrostatic elements 18a and 18b can be suppressed even though they are formed in a multilayered structure.

The application of voltage to the pair of electrodes 24 and 26 is conducted through the terminals (i.e. pads) 28 and 30 which are formed on the electrodes 24 and 26 located at the position above the side surfaces of the fixing section 14 (i.e. surfaces on which the piezo-electric/electrostrictive elements are formed). The terminals 28 and 30 are formed so that the terminal 28 corresponding to the electrodes 24 is located at a position close to the bottom end of the fixing section 14, and the terminal 30 at the outer space side corresponding to the electrodes 26 is located at the position close to the inner wall of the fixing section 14.

In this case, the fixation of the piezo-electric/electrostrictive device 10 can be conducted using its surfaces other than the surfaces on which the terminals 28 and 30 are formed. As a result, high reliability can be attained for both the fixation of the piezo-electric/electrostrictive device 10, and the electric connection between the circuits and the terminals 28 and 30. In this structure, the terminals 28 and 30 are electrically connected to the circuits by a flexible printing circuit (also referred to as FPC), flexible flat cable (also referred to as FFC), wire bonding and the like.

By use of the piezo-electric/electrostrictive elements 18a and 18b having a multilayered structure, the driving force of the actuators 19a and 19b is increased, and large displacement is attained accordingly. In addition, the rigidity of the piezo-electric/electrostrictive device 10 itself is also increased, and high resonance frequency is attained accordingly thereby easily speeding-up the displacement movement.

As the actuators 19a and 19b have an increased number of stages, their driving force increases; however, consumption of the electric power also increases accordingly. Therefore, when the present invention is carried out, the number of stages of the actuators 19a and 19b and the like may be determined in accordance with the application and use conditions of the piezo-electric/electrostrictive device. In the piezo-electric/electrostrictive device 10 according to this embodiment, by use of the piezo-electric/electrostrictive elements 18a and 18b, the width (i.e. the distance in the direction of Y axis) of the thin plate sections 12a and 12b basically remains unchanged even if the driving force of the actuators 19a and 19b are increased. A thus-structured piezo-electric/electrostrictive device 10 is more preferable for use in an actuator for positioning a magnetic head for a hard disk and ringing control, which is used in a space with an extremely small width.

Figure 2:
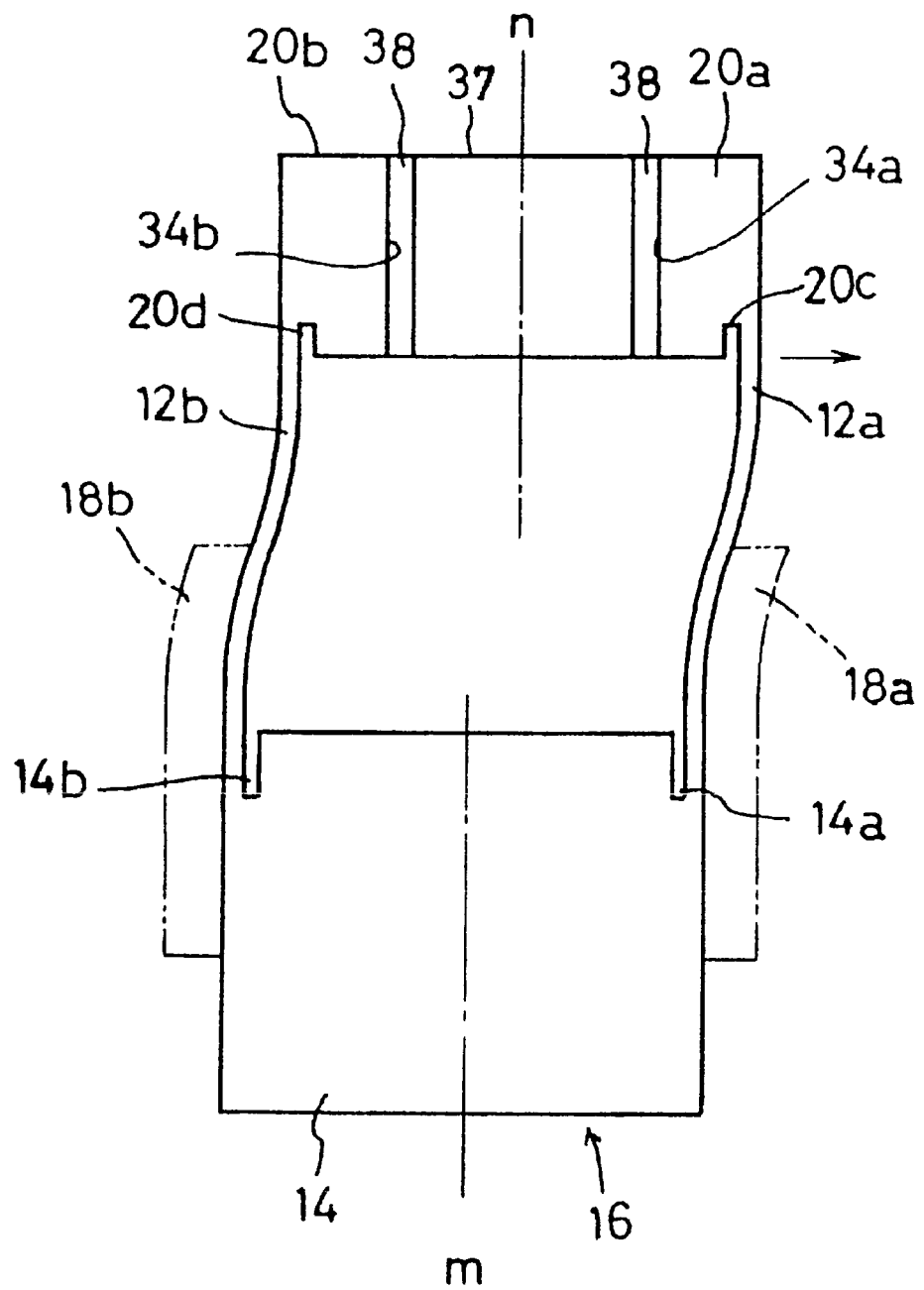
FIG. 2 is an explanatory diagram showing the movement of a piezo-electric/electrostrictive device.

Next, the movement of the piezo-electric/electrostrictive device 10 will be described referring to FIG. 2.

When the two piezo-electric/electrostrictive elements 18a and 18b are in a natural state, that is, the piezo-electric/electrostrictive elements 18a and 18b do not perform a displacement movement, the longitudinal axis m of the piezo-electric/electrostrictive device 10 substantially coincides with the central axis of the fixing section 14.

In this state, a sine wave Wa having a specified bias electric potential Vb is applied to the pair of electrodes 24 and 26 of the piezo-electric/electrostrictive elements 18a. On the other hand, a sine wave Wb having a phase different from the sine wave Wa by substantially 180° is applied to the pair of electrodes 24 and 26 of the other piezo-electric/electrostrictive element 18b.

At a stage where, for example, a voltage of a maximum value is applied to the pair of electrodes 24 and 26 of the piezo-electric/electrostrictive element 18a, the piezo-electric/electrostrictive layer 22 of the piezo-electric/electrostrictive layer 22 displaces to shrink in a direction toward its major surface. As shown in FIG. 2, a stress is applied to the thin plate section 12a in such a direction as to cause the thin plate section 12a to become warped toward, for example, a right direction as shown by an arrow A, and as a result, the thin plate section 12a is warped toward a right direction. At this time, since no voltage is applied to the pair of electrodes 24 and 26 of the other piezo-electric/electrostrictive element 18b, the thin plate section 12b follows the warpage of the thin plate section 12a and is also warped toward a right direction. As a result, the movable sections 20a and 20b, and the spacer 37 displace toward, for example, a right direction with respect to the longitudinal axis m of the piezo-electric/electrostrictive device 10b. The amount of displacement varies in accordance with the maximum value of the voltage applied to the piezo-electric/electrostrictive elements 18a and 18b. For example, as the maximum value of the voltage increases, the amount of displacement becomes larger.

In the case where a piezo-electric/electrostrictive material having high coercive electric field is employed as a material of the piezo-electric/electrostrictive layer 22, the bias electric potential may be adjusted so that the minimum values of the sine waves Wa and Wb are at slightly negative levels. In this case, either one of the piezo-electric/electrostrictive elements to which the sine wave Wa or Wb at a slightly negative level is applied (for example, the piezo-electric/electrostrictive element 18b) is driven, and a stress in the same direction as the direction of warpage of the thin plate section 12a is applied to the thin plate section 12b. As a result, it becomes possible to further increase the amount of displacement of the movable sections 20a and 20b, and the spacer 37. That is, the employment of the waveform described above makes it possible that the piezo-electric/electrostrictive elements 18b or 18a to which the sine wave at a negative level is applied supports the function of the piezo-electric/electrostrictive elements 18a or 18b which plays a main role of the displacement movement.

As described above, in the piezo-electric/electrostrictive device 10 according to one embodiment of the present invention, a small displacement of the piezo-electric/electrostrictive elements 18a and 18b is amplified into a large displacement movement by using the warpage of the thin plate sections 12a and 12b, and then is transmitted to the movable sections 20a and 20b. In this manner, the movable sections 20a and 20b can be largely displaced with respect to the longitudinal axis m of the piezo-electric/electrostrictive device 10b.

Particularly, in this embodiment, the movable sections 20a and 20b are formed with attachment surfaces 34a and 34b in an opposed relation to each other. The distance Lc between the attachment surfaces 34a and 34b is set at a value of about 1.5 times longer than the length Df of the movable sections 20a and 20b. In addition, a large spacer 37 is attached between the attachment surfaces 34a and 34b via an adhesive 38. In this case, the attachment surfaces 34a and 34b in an opposed relation to each other are spaced from each other, or a spacer 37 having a weight smaller than the constituent elements of the movable sections 20a and 20b is interposed between the attachment surfaces 34a and 34b in an opposed relation to each other. In this manner, weight reduction of the movable sections 20a and 20b can be effectively achieved, and the resonance frequency can be increased without lowering the displacement amount of the movable sections 20a and 20b.

In this embodiment, the term "frequency" means a frequency of the waveform of voltage obtained when the voltage applied to the pair of electrodes 24 and 26 is alternately switched, and the movable sections 20a and 20b are displaced in left and right directions. The term "resonance frequency" means a maximum frequency at which the movable sections 20a and 20b can manage to displace in a specified vibration mode.

In the piezo-electric/electrostrictive device 10 according to the embodiment of the present invention, the movable sections 20a and 20b, the thin plate sections 12a and 12b, and the fixing section 14 are integrally formed into one-piece unit. All of them are not required to be made of a piezo-electric/electrostrictive material, which is a material relatively heavy in weight. The piezo-electric/electrostrictive device with this structure 10 has high mechanical strength, excellent handling characteristics, high impact resistance and moisture resistance, and is resistant to harmful vibrations (for example, residual vibrations in high-speed operation or vibrations generated by a noise).

Furthermore, in this embodiment of the present invention, in the case where the attachment surfaces 34a and 34b in an opposed relation to each other are spaced, the movable section 20a including the attachment surface 34a and the movable section 20b including the attachment surface 34b can be easily warped, and become resistant to deformation. This structure gives excellent handling characteristics to the piezo-electric/electrostrictive device 10.

Due to the presence of the attachment surfaces 34a and 34b in an opposed relation, the movable sections 20a and 20b respectively have a large surface area. When another member is attached to the movable sections 20a and 20b, large area can be used for attaching the member, thereby firmly attaching the member. When taking into consideration the case where a member is attached with an adhesive for example, the member is attached through not only the major surfaces of the movable sections 20a and 20b but also the attachment surface 34a and 34b in an opposed relation. In this manner, the member can be firmly attached.

In this embodiment of the present invention, the piezo-electric/electrostrictive elements 18a and 18b are formed with the piezo-electric/electrostrictive layer 22, and the pair of electrodes 24 and 26 which interposes the piezo-electric/electrostrictive layer 22 therebetween. Among the pair of electrodes 24 and 26, the electrode 24 is directly formed at least on the side surface of the thin plate sections 12a and 12b. In this manner, the vibration generated by the piezo-electric/electrostrictive elements 18a and 18b can be efficiently transmitted to the movable sections 20a and 20b through the thin plate sections 12a and 12b. As a result, responseness is enhanced.

In this embodiment of the present invention, as shown in FIG. 1 for example, the portion in which the pair of electrodes 24 and 26 overlap each other in the state of interposing the piezo-electric/electrostrictive layer 22 therebetween (i.e., a substantial driving portion 40) is continuously formed starting from a part of the fixing section 14 to a part of the thin plate sections 12a and 12b. If the substantial driving portion 40 is so constructed as to extend to reach a part of the movable sections 20a and 20b, there may be the possibility that the displacement movement of the movable sections 20a and 20b counteracts the deformation of the substantial driving portion 40 and the deformation of the thin plate sections 12a and 12b, and large displacement cannot be attained. Contrarily, in this embodiment, the substantial driving portion 40 is so constructed as not to extend to reach the movable sections 20a and 20b, but to cover only the fixing section 14. This structure avoids the disadvantage that the displacement movement of the movable sections 20a and 20b is limited, thereby increasing the displacement amount of the movable sections 20a and 20b.

On the contrary, when the piezo-electric/electrostrictive elements 18a and 18b are formed on a part of the movable sections 20a and 20b, it is preferable that the substantial driving portion 40 is positioned in an area extending from a part of the movable sections 20a and 20b to a part of the thin plate sections 12a and 12b. This is because if the substantial driving portion 40 is so constructed as to extend to reach a part of the fixing section 14, the displacement movement of the movable sections 20a and 20b is restricted, as described above.

In the above-described embodiment, the movable sections 20a and 20b have attachment surfaces 34a and 34b respectively, and the spacer 37 is attachedly mounted therebetween. Alternatively, it is possible to form end surfaces 34a and 34b in the fixing section 14. In this case, for example, the movable sections 20a and 20b are integrally combined into one-piece unit at the top end of the pair of thin plate sections 12a and 12b, while the end surfaces 34a and 34b in an opposed relation to each other are formed in the fixing section 14.

In this arrangement, the piezo-electric/electrostrictive device 10c can be firmly fixed to a specified fixing position, and increased reliability can be obtained, on top of the advantages obtained in the case where the movable sections 20a and 20b respectively have the attachment surfaces 34a and 34b in an opposed relation to each other. The length of the substantial driving portion 40 is preferably 20 to 95 percent, and more preferably 40 to 80 percent with respect to the length of the thin plate section 12a and 12b.

Figure 3A:
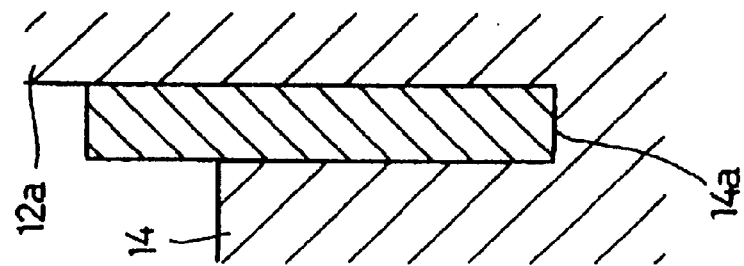
FIG. 3 is an explanatory diagram showing another shape of filler filled into the recess.

When the recess has a rectangular shape, the filler to be provided therein may have shapes as shown in FIG. 3. In the embodiment shown in FIG. 1, the filler can be filled up to the opening of the recess having a rectangular shape. In the embodiment shown in FIG. 3(a), the filler is filled about halfway the recess, and the area near the opening is free from the filler. In this case, the filler in a specified amount is filled into the recess. The arrangement shown in FIG. 3(a) has an advantage that the end surface of the fillers can be made into the same shape each other. If the recess has a hollow portion in which no filler is provided is formed at its bottom, the effect of dispersing the stress is not adversely affected.

Figure 3B:
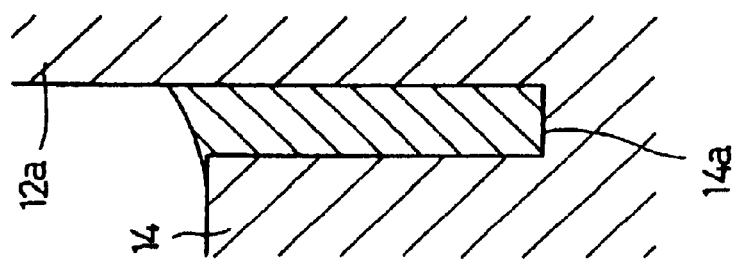

In the embodiment shown in FIG. 3(b), the filler is provided in the recess beyond the opening thereof. This arrangement is advantageous in the case where the filler has weak adhesion, because the filler can be attached inside the recess in a large area, thereby increasing the adhesion of the entire filler. By forming the outer surface of the filler into an R-shape, the filler can be more firmly fixed into the recess, and never peels off at its end portion.

Figure 3C:
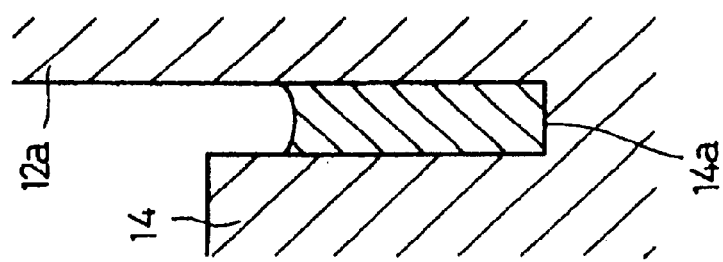

Alternatively, the filler formed into the shape as shown in FIG. 3(c) may be provided in the recess. In this case, the shape of the area between the thin plate section and the fixing section or the movable section assumes a step-like shape, that is, the area is occupied by the corner of the filler. This shape of filler is effective, together with the physical properties of the filler, in further reducing the concentration of stress onto the base portion of the thin plate sections.

Next, a preferable example of the structure of the piezo-electric/electrostrictive device 10 according to an embodiment of the present invention will be described.

In order to assure the displacement movement of the movable sections 20a and 20b, the distance Dg of the substantial driving portion 40 of the piezo-electric/electrostrictive elements 18a and 18b which overlaps the movable sections 20a and 20b is preferably made to be ½ or larger the thickness Dd of the thin plate sections 12a and 12b.

Defining the distance between the inner walls of the thin plate sections 12a and 12b as Da (i.e., the distance in the direction of X axis), and the width of the thin plate sections 12a and 12b as Db (i.e. the distance in the direction of Y axis), the ratio of Da to Db (Da/Db) is within a range of 0.5 to 20, preferably 1 to 15, and more preferably 1 to 10. The ratio Da/Db is a value determined based on the finding that, at this value, a large amount of displacement of the movable sections 20a and 20b can be obtained, and the displacement within X-Z plane can be predominantly obtained.

Defining the length between the thin plate sections 12a and 12b (i.e., the distance in the direction of Z axis) as De, and the distance between the inner walls of the thin plate sections 12a and 12b as Da, the ratio of De to Da (De/Da) is preferably made to 0.5 to 10, and more preferably 0.5 to 5. The ratio De/Da is a value determined based on the finding that, at this value, a large amount of displacement of the movable sections 20a and 20b interposing the spacer 37 therebetween can be obtained, and the displacement movement can be conducted at high resonance frequency (i.e., high response speed can be attained).

According to the present invention, in order that the piezo-electric/electrostrictive device 10 has a structure in which the agitated displacement or vibration in the direction of the Y-axis is suppressed, and a high responsiveness is achieved as well as a large displacement at relatively low voltages, the ratio of Da/Db is preferably made to 0.5 to 20, and the ratio of De/Da is preferably 0.5 to 10. More preferably, the ratio of Da/Db is 1 to 10, and the ratio of De/Da is 0.5 to 5.

Furthermore, in the piezo-electric/electrostrictive device 10, a hole section 42 is formed by the inner walls of the pair of thin plates 12 and 12b, the inner walls of the movable section 20a and 20b, and the inner wall of the spacer 37 (and the inner wall of the adhesive 38), and the inner wall of the fixing section 14. The hole section 42 is preferably filled with a gel material such as silicon gel. In a conventional case, the displacement movement of the movable sections 20a and 20b is usually restricted by the presence of the filler. Contrarily, in the embodiment of the present invention, the weight of the movable sections 20a and 20b is reduced by forming the end surfaces 34a and 34b on the movable sections 20a and 20b, and an increase in the amount of the displacement of the movable sections 20a and 20b is aimed. As a result, there is no restriction by the filler on the displacement movement of the movable sections 20a and 20b, and a high resonance frequency and high rigidity are advantageously attained as an effect of the presence of the filler.

The length Df of the movable sections 20a and 20b (i.e., the distance in the direction of Z axis) as Df is preferably short. By using the movable sections 20a and 20b short in length, the weight of the device can be reduced, and the resonance frequency can be increased. In addition, the displacement can be enhanced when an article is held. However, in order to give high rigidity in the direction of X axis to the thin plate sections 12a and 12b, and to ensure their proper displacement, the ratio of the length Df of the movable sections 20a and 20b with respect to their thickness Dd is made to be 2 or larger, and preferably 5 or larger.

The actual size of each member is decided taking into consideration the attachment area between the movable sections 20a and 20b and another member attached thereto, the attachment area between the fixing section 14 and another member attached thereto, the attachment area between the terminals for electrodes and the device, the strength, durability, and required amount of displacement, resonance frequency of the entire piezo-electric/electrostrictive device 10, the driving voltage, and the like.

Specifically, the distance Da between the inner walls of the thin plate sections 12a and 12b is preferably 100 to 2000

μm, and more preferably 200 to 1600 μm. The width Db of the thin plate sections 12a and 12b is preferably 50 to 2000 μm, and more preferably 100 to 500 μm. The thickness Dd of the thin plate sections 12a and 12b is made to be smaller than the width Db of the thin plate sections 12a and 12b, that is, to satisfy the relationship of Db>Dd in order that the agitated displacement, which is a displacement component in the direction of Y axis, can be effectively suppressed, and is preferably made to 2 to 100 μm, and more preferably 10 to 80 μm.

The length De of the thin plate sections 12a and 12b is preferably made to 200 to 3000 μm, and more preferably 300 to 2000 μm. The length Df of the movable sections 20a and 20b is preferably made to 50 to 2000 μm, and more preferably 100 to 1000 μm, and much more preferably 200 to 600 μm.

By employing the structure described above, the displacement in the direction of Y-axis never exceeds 10 percent with respect to the displacement in the direction of X-axis, while the drive at a low voltage is possible and the displacement component in the direction of Y-axis can be suppressed to 5 percent or lower by properly adjusting the size of each member so that the actual sizes satisfies the size ratios described above. Specifically, the movable sections 20a and 20b are displaced in the direction of substantially one axis, that is, X-axis. In addition, high responsiveness is attained, and large displacement can be obtained at relatively low voltages.

In the piezo-electric/electrostrictive device 10, the movable sections 20a and 20b, and the fixing section 14 assume a rectangular shape, unlike the plate-like shape as of a conventional device (where the thickness in the direction perpendicular to the displacement direction is small). In addition, the thin plate sections 12a and 12b are provided in such a manner that the movable sections 20a and 20b are successive with the side surface of the fixing section 14. As a result, the rigidity of the piezo-electric/electrostrictive device 10 in the direction of Y axis can be selectively increased.

Specifically, in the piezo-electric/electrostrictive device 10 having a size constitution as described above, the movable sections 20a and 20b alone can be selectively moved within a plane (i.e., within a XZ plane), while suppressing the movement of the movable sections 20a and 20b in a YZ plane (that is, the movement in the agitated direction).

Next, each constituent element of the piezo-electric/electrostrictive device 10 according to an embodiment of the present invention will be described.

As described above, the movable sections 20a and 20b move based on the driving amount of the thin plate sections 12a and 12b, and have various members in accordance of the intended use of the piezo-electric/electrostrictive device 10. For example, when the piezo-electric/electrostrictive device 10 is used as a displacement element, a screening plate for shutting out light is mounted. Particularly, when the piezo-electric/electrostrictive device 10 is used for positioning a magnetic head of hard disk drive or a ringing suppressing mechanism, a member is required for positioning, such as a magnetic head, a slider having a magnetic head, a suspension having a slider and the like is mounted thereon.

As described above, the fixing section 14 supports the thin plate sections 12a and 12b, and the movable sections 20a and 20b. When the piezo-electric/electrostrictive device 10 is used for positioning the magnetic head of the hard disk drive, the entire piezo-electric/electrostrictive device 10 is firmly fixed by supportedly fixing the fixing section 14 to a carriage arm attached to a voice coil motor (VCM), a fixing plate or a suspension attached to the carriage arm. In some cases, to the fixing section 14, terminals 28 and 30 or other members for driving the piezo-electric/electrostrictive elements 18a and 18b may be provided.

As a material for constituting the movable sections 20a and 20b, and the fixing section 14, any material may be employed as far as it has sufficient rigidity. Ceramics, which enable the employment of a ceramic green sheet laminating method, are preferred. Examples of the material include materials containing zirconia, such as stabilized zirconia and partially stabilized zirconia, alumina, magnesia, silicon nitride, aluminum nitride, titanium oxide, or a mixture thereof as a main component. Among them, a material containing zirconia, and especially a material containing stabilized zirconia and a material containing a partially stabilized zirconia a main component are preferable, because they exhibit high mechanical strength and high toughness.

As described above, the thin plate sections 12a and 12b are driven by the displacement of the piezo-electric/electrostrictive elements 18a and 18b. The thin plate sections 12a and 12b are members in the form of a flexible thin plate. The thin plate sections 12a and 12b amplify the shrinking displacement of the piezo-electric/electrostrictive elements 18a and 18b provided on the surface thereof into a flexion displacement, and transmit the flexion displacement into the movable sections 20a and 20b. The shape and material of the thin plate sections 12a and 12b are not specifically limited as long as they have sufficient flexibility and mechanical strength to the extent that they are not damaged by the flexion deformity, and are properly determined taking into consideration the responsiveness and operability of the movable sections 20a and 20b.

The thickness Dd of the thin plate sections 12a and 12b is preferably 2 to 100 μm, and the thickness of the thin plate sections 12a and 12b, and the piezo-electric/electrostrictive elements 18a and 18b in combination, is preferably 7 to 500 μm. The thickness of the electrodes 24 and 26 is preferably 0.1 to 50 μm, and the thickness of the piezo-electric/electrostrictive layer 22 is preferably 3 to 300 μm.

As a material for constituting the thin plate sections 12a and 12b, the same kinds of ceramics as those used for the movable sections 20a and 20b and the fixing section 14 are preferably used. Among them, the most preferable is a material containing stabilized zirconia as a main component and a material containing a partially stabilized zirconia, because they exhibit high mechanical strength and high toughness even if they are made into a thin plate, and have a small reactiveness with the materials of the piezo-electric/electrostrictive layer and electrodes.

The zirconia is preferably stabilized or partially stabilized in the following manner. That is, compounds for stabilizing or partially stabilizing the zirconia include yttrium oxide, ytterbium oxide, cerium oxide, calcium oxide, and magnesium oxide. At least one is added to the zirconia, or two or more of them in combination is added to the zirconia, thereby obtaining the aimed stabilized or partially stabilized zirconia.

The addition amount of the respective compound is, in the case of yttrium oxide and ytterbium oxide, 1 to 30 mole percent, and preferably 1.5 to 10 mole percent. In the case of cerium oxide, 6 to 50 mole percent, and preferably 8 to 20 mole percent. In the case of calcium oxide and magnesium oxide, 5 to 40 mole percent, and preferably 5 to 20 mole percent. Among them, it is preferable to use yttrium oxide as a stabilizer. In this case, the addition amount of the yttrium oxide is 1.5 to 10 mole percent, and more preferably 2 to 4 mole percent. It is also possible to add additives, such as a sintering assistant, such as alumina, silica, and transition metal oxides in an amount ranging from 0.05 to 20 weight percent. When the piezo-electric/electrostrictive elements 18a and 18b are formed by a film formation method where green sheets are sintered to be integrated into one-piece unit, it is also preferable to add additives such as alumina, magnesia, and transition metal oxides.

In order to obtain high mechanical strength and a stabilized crystal phase, the average particle diameter of the zirconia crystals is preferably 0.05 to 3 μm, and more preferably 0.05 to 1 μm. In addition, as described above, the thin plate sections 12a and 12b may be constituted by the same type of ceramics as that used for the movable sections 20a and 20b and the fixing section 14. Preferably, it is advantageous to use the same material for all the thin plate sections 12a and 12b, the movable sections 20a and 20b, and the fixing section 14, in order to attain high reliability at the connection areas therebetween, to give high strength to the piezo-electric/electrostrictive device 10, and to prevent complicated production of the device.

The piezo-electric/electrostrictive elements 18a and 18b at least have the piezo-electric/electrostrictive layer 22, and the pair of electrodes 24 and 26 for applying an electric field to the piezo-electric/electrostrictive layer 22. As the piezo-electric/electrostrictive elements 18a and 18b, a piezo-electric/electrostrictive element of a unimorph-type, a bimorph-type or the like may be used. Among them, the unimorph-type element is more suitable for use in the piezo-electric/electrostrictive device 10, because in combination with the thin plate sections 12a and 12b, the unimorph-type element has a higher ability to stabilize the amount of displacement generated and is advantageous in reducing the weight of the device.

It is preferable that, as shown in FIG. 1, the piezo-electric/electrostrictive elements 18a and 18b are formed at the side surface of the thin plate sections 12a and 12b. This structure is preferable in that the thin plate sections 12a and 12b can produce larger displacement movement.

As a material for the piezo-electric/electrostrictive layer 22, piezo-electric ceramics are preferably used. Alternatively, it is also possible to use electrostrictive ceramics, ferroelectric ceramics, or antiferroelectric ceramics. When the piezo-electric/electrostrictive device 10 is used for positioning a magnetic head of hard disk drive and the like, it is important to keep the linearity between the displacement amount of the movable sections 20a and 20b and the driving voltage or output voltage. For this reason, it is preferable to use a material having a small strain history, as well as having a coercive electric field of 10 kV/mm or smaller.

Specific examples of the piezo-electric/electrostrictive layer 22 are ceramics containing lead zirconate, lead titanate, magnesium lead niobate, nickel lead niobate, zinc lead niobate, manganese lead niobate, antimony lead stannate, manganese lead tungstate, cobalt lead niobate, barium titanate, sodium tinanate bismuth, potassium-sodium niobate, srontium tantalate bismuth, and the like alone or in combination thereof.

Among them, ceramics containing lead zirconate, lead titanate, and magnesium lead niobate as a main component, and ceramics containing sodium titanate bismuth as a main component are preferred. This is because these ceramics have high electromechanical coupling factor and piezoelectric constant, and exhibit small reactivity with the thin-plate sections (ceramics) 12a and 12b when calcined to form piezo-electric/electrostrictive layer 22. In addition, the resultant piezo-electric/electrostrictive layer 22 has stable composition.

It is also possible to use ceramics containing, on top of the above-described components, oxides of lanthanum, calcium, strontium, molybudenum, tungsten, barium, niobium, zinc, nickel, manganese, cerium, cadmium, chromium, cobalt, antimony, iron, yttrium, tantalum, lithium, bismuth, tin and the like alone or in combination thereof.

For example, by adding lanthanum and strontium to lead zirconate, lead titanate, and lead niobate which are main components of the zirconia, there are advantages in some cases that the coercive electric field and piezo-electric characteristics become controllable.

It is preferable to avoid the use of material subject to vitrification, such as silica. This is because a material such as silica easily reacts with the material of piezo-electric/electrostrictive layer 22 during the heat treatment thereof. As a result of the reaction with the silica, the composition of the piezo-electric/electrostrictive layer 22 fluctuates and the piezo-electric characteristics thereof are impaired.

The pair of electrodes 24 and 26 formed in the piezo-electric/electrostrictive elements 18a and 18b are preferably constituted by a metal which is in a solid state at a room temperature and has high conductivity. Examples of such metals include aluminum, titanium, chromium, iron, cobalt, nickel, copper, zinc, niobium, molybdenum, ruthenium, palladium, rhodium, silver, tin, tantalum, tungsten, iridium, platinum, gold, lead, and alloys thereof. Alternatively, it is also possible to use a cermet material in which the same material or a different material from the material used for the piezo-electric/electrostrictive layer 22 or the material used for the thin plate sections 12a and 12b is dispersed.

The material of the electrodes 24 and 26 formed in the piezo-electric/electrostrictive elements 18a and 18b is decided depending on the method for forming the piezo-electric/electrostrictive layer 22. For example, when the electrode 24 is formed on the thin plate sections 12a and 12b, and after that the piezo-electric/electrostrictive layer 22 is formed on the electrode 24 by sintering, a high-melting point metal such as platinum, palladium, platinum-palladium alloy, silver-palladium alloy the like is required. On the other hand, when the electrode 26 is formed on the piezo-electric/electrostrictive layer 22 as the outermost layer after the piezo-electric/electrostrictive layer 22, it may be formed at low temperature, and therefore, may be mainly made of a low-melting point metal such as aluminum, gold, silver and the like as a main component.

The thickness of the electrodes 24 and 26 may be a considerably large factor that deteriorates the displacement of the piezo-electric/electrostrictive elements 18a and 18b. Therefore, as a material of the electrode formed after the formation of the piezo-electric/electrostrictive layer 22 by sintering, it is preferable to use an organometallic paste which forms a fine and thin film after sintering, such as gold resinated paste, platinum resinated paste, and silver reginated paste.

The above embodiment shows the case where the movable sections 20a and 20b integrally formed with the thin plate sections 12a and 12b at their top ends have a thickness larger than the thickness Dd of the thin plate sections 12a and 12b. Alternatively, the movable sections 20a and 20b may have a thickness substantially same as the thickness Dd of the thin plate sections 12a and 12b. With this arrangement, when an article is mounted to the movable sections 20*a* and 20*b*, the article having a size matching the distance between the thin plate sections 12*a* and 12*b* can be mounted in such a manner as to be interposed between the movable sections 20*a* and 20*b*. In this case, the adhesive region (for example, the adhesive 38) used for mounting the article corresponds to the movable sections 20*a* and 20*b*.

This structure further has the following advantages. The piezo-electric/electrostrictive device 10 can be preferably used in various sensors, such as ultrasonic sensors, acceleration sensors, angular velocity sensors, impact sensors, mass sensors and the like. By properly adjusting the size of the article to be mounted in a space extending from the end surfaces 34*a* and 34*b* to the thin plate sections 12*a* and 12*b*, the sensitivity of the sensor can be easily adjusted.

Next, the piezo-electric/electrostrictive device 10 according to second, third and fourth embodiments where the end surfaces 34*a* and 34*b* are formed, will be described referring to FIG. 4–FIG. 8. However, the present invention can be carried out with no problem even if no end surfaces 34*a* and 34*b* are formed.

In the second embodiment, the piezo-electric/electrostrictive device 10*a* has substantially the same structure as of the piezo-electric/electrostrictive device 10 described above, as shown in FIG. 4, except that the structures of the recess and the filler are different on the following points.

The recesses 14*a* and 14*b* have a step-like structure, and the portion closer to the thin plate section has a larger depth. In this structure, the concentrated stress generated at the boundary between the thin plate sections, and the movable sections and the fixing portion, can be dispersed more effectively. The portion of the recess larger in width greatly serves to absorb the impact and disperse the concentrated stress efficiently.

Particularly, the electrode 26 located under the first layer is formed to substantially continue over the side surface of the thin plate sections 12*a* and 12*b*, the movable sections 20*a* and 20*b* to the fixing section 14. Then, a part of the electrode 26 is separated at the side surface of the fixing portion 14 to form a slit 70. The slit 70 is formed for the following purposes: 1) to prevent the actuator from driving at the bottom end portion 72 of the piezo-electric/electrostrictive elements 18*a* and 18*b* (i.e., the portion from the bottom end portion of the slit 70 to the bottom end of the fixing section 14); 2) to suppress the generation of short circuit at the end of the terminal 28; and 3) to provide an electrode material under the piezo-electric/electrostrictive layer 22 at the bottom end of the piezo-electric/electrostrictive elements 18*a* and 18*b*. If it is not preferable to form the slit 70, the slit 70 is not necessarily formed and may be omitted.

Figure 5A:
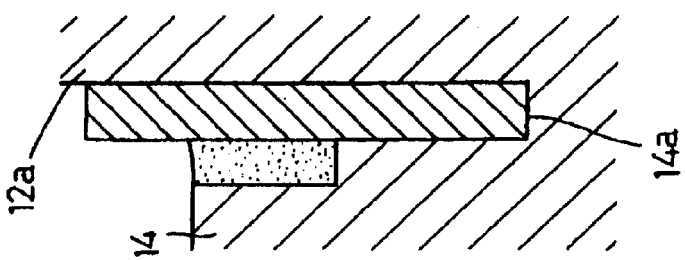
FIG. 5 is an explanatory diagram showing a filler having a shape different from the shape shown in FIG. 4.
Figure 5B:
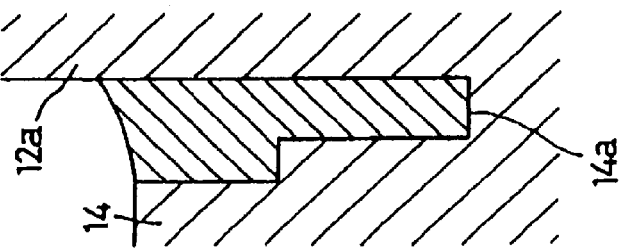
Figure 5C:
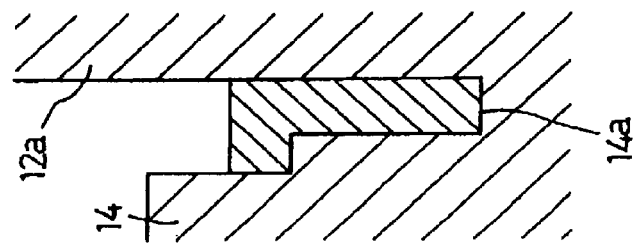

FIG. 5 shows the shape of the filler filled into the recess. In the embodiment shown in FIG. 5(*a*), the filler fills the recess about halfway, and the area near the opening is free from the filler. If the recess has a hollow portion in which no filler is provided is formed at its bottom, the effect of dispersing the stress is not adversely affected. In the embodiment shown in FIG. 5(*b*), the filler is provided in the recess beyond the opening thereof. This arrangement is advantageous where the filler has weak adhesion, because the filler can be attached inside the recess in a large area thereby increasing the adhesion of the entire filler. By forming the outer surface of the filler into R-shape, the filler can be more firmly fixed into the recess, and never peels off at its end portion. FIG. 5(*c*) shows the case where the filler is made of different materials from each other for the respective layers which form the recess together. It is preferable to determine the combination of the materials to attain the effect of dispersing the stress by properly selecting the physical properties of the materials such as degree of elasticity and porosity, and attachment to the constituent elements.

Figure 4:
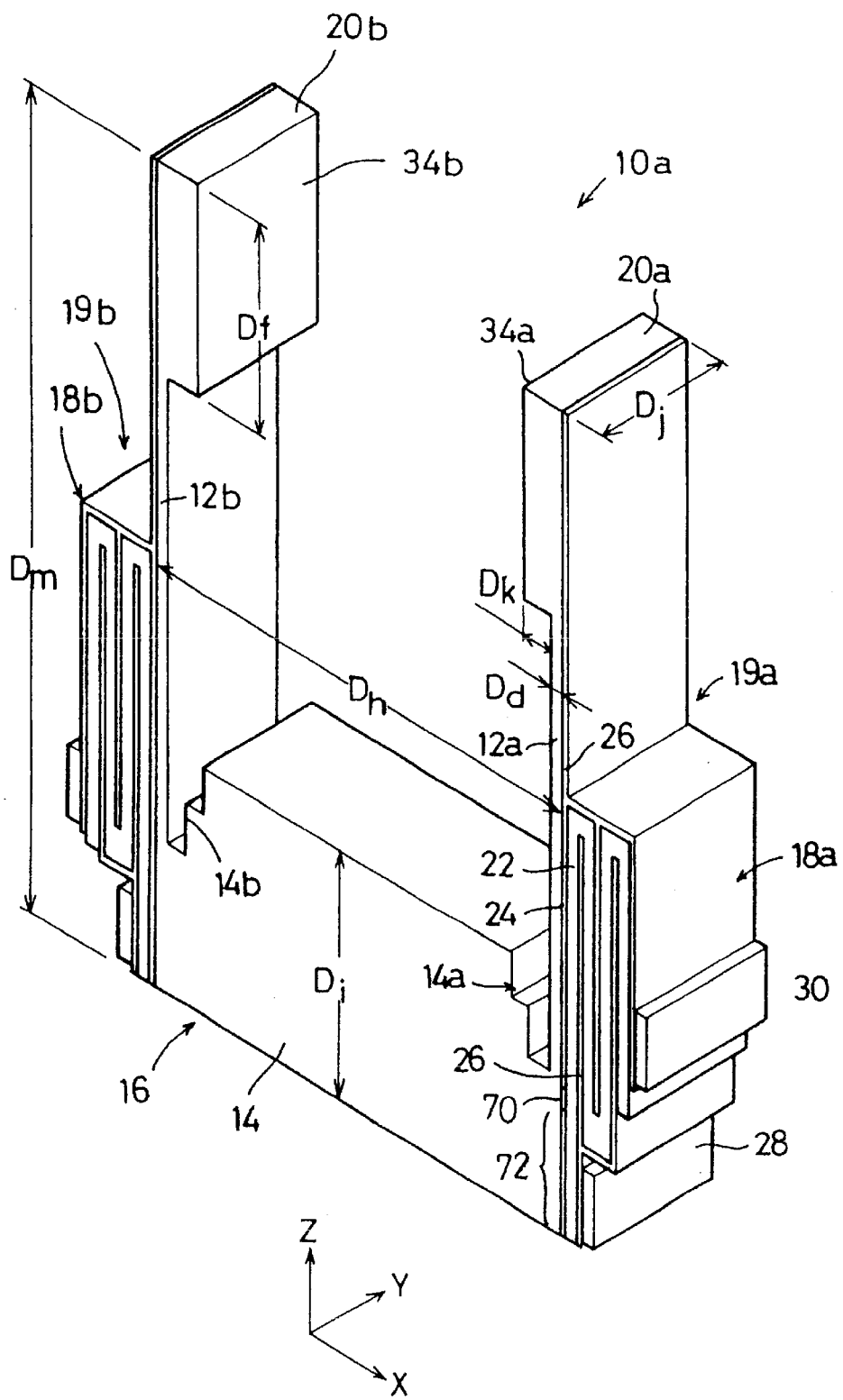
FIG. 4 is a perspective view showing a piezo-electric/electrostrictive device having a recess of another type.
Figure 6:
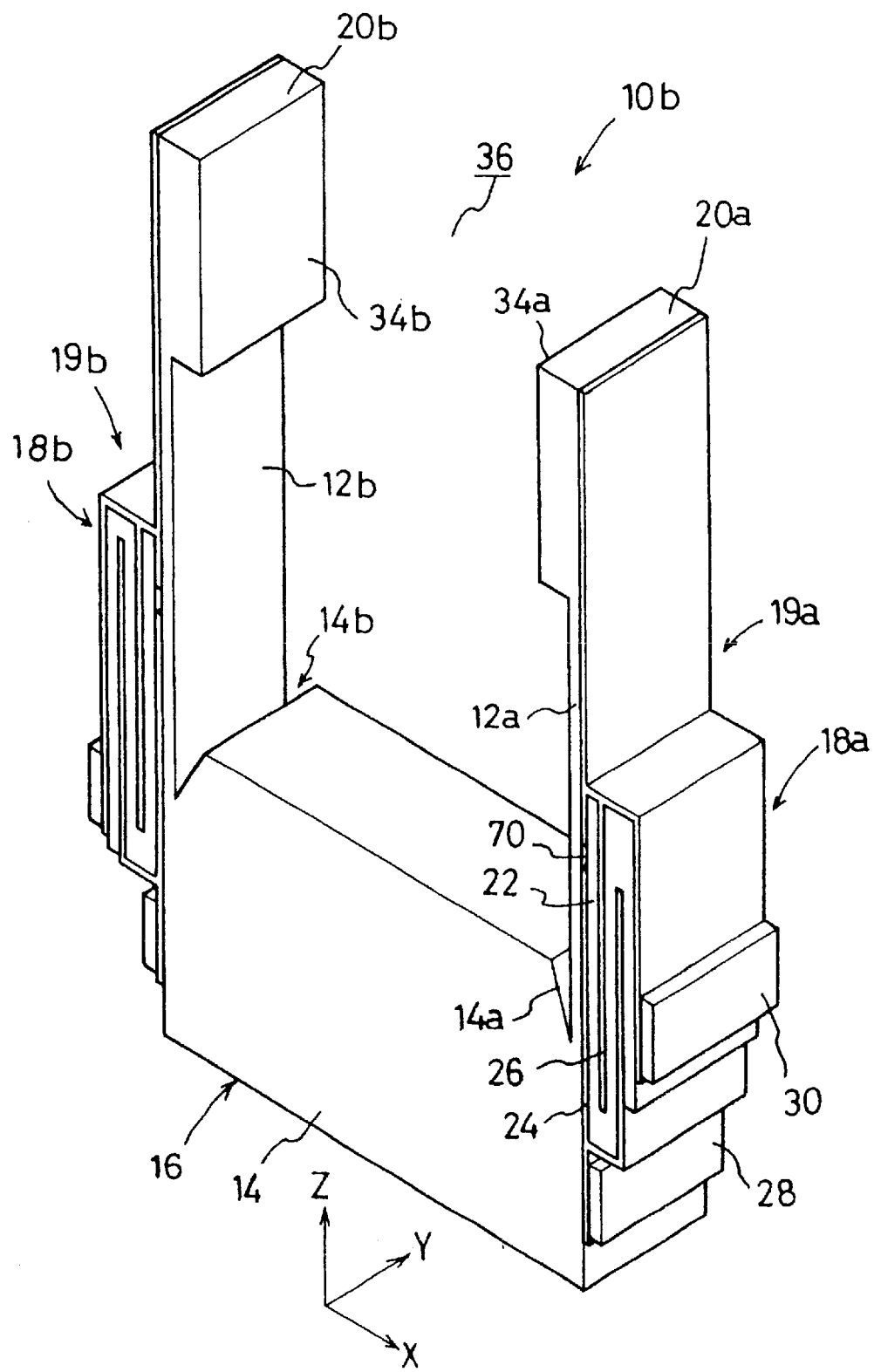
FIG. 6 is a perspective diagram showing a piezo-electric/electrostrictive device having a recess of another type.

The piezo-electric/electrostrictive device 10*b* according to the third embodiment has a structure in which the recess shown in FIG. 6 is formed into the tapered shape constituted by infinite multiple steps, whereas the device shown in FIG. 4 has the recess formed into the shape of two steps in its depth direction. The concentrated stress generated at the boundary between the thin plate sections, and the movable sections and the fixing section can be effectively dispersed. The portion of the recess being larger in width greatly serves to adsorb an impact, and allows the concentrated stress to disperse efficiently.

Figure 7B:
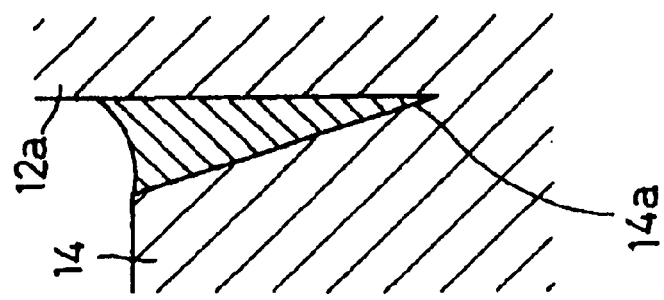
FIG. 7 is an explanatory diagram showing a filler having a shape different from the shape shown in FIG. 6.
Figure 7A:
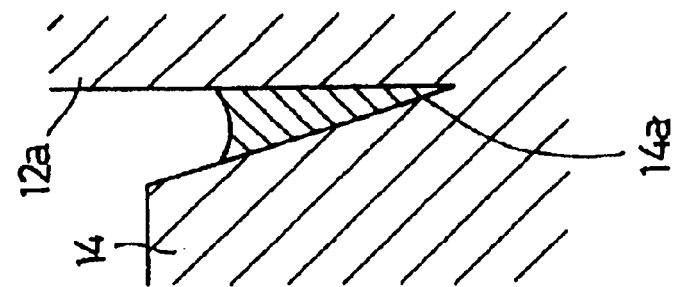

FIG. 7 shows the shape of the filler to be filled in the recess. In the embodiment shown in FIG. 7(*a*), the filler is filled about halfway into the recess, and the area near the opening is free from the filler. If the recess has a hollow portion in which no filler is provided at its bottom, the effect of dispersing the stress is not adversely affected. Contrarily, in the embodiment shown in FIG. 7(*b*), the filler is provided in the recess beyond the opening thereof. This arrangement is advantageous where the filler has weak adhesion, because the filler can be attached inside the recess in a large area thereby increasing the adhesion of the entire filler. By forming the outer surface of the filler into R-shape, the filler can be more firmly fixed into the recess, and never peels off at its end portion.

Figure 8:
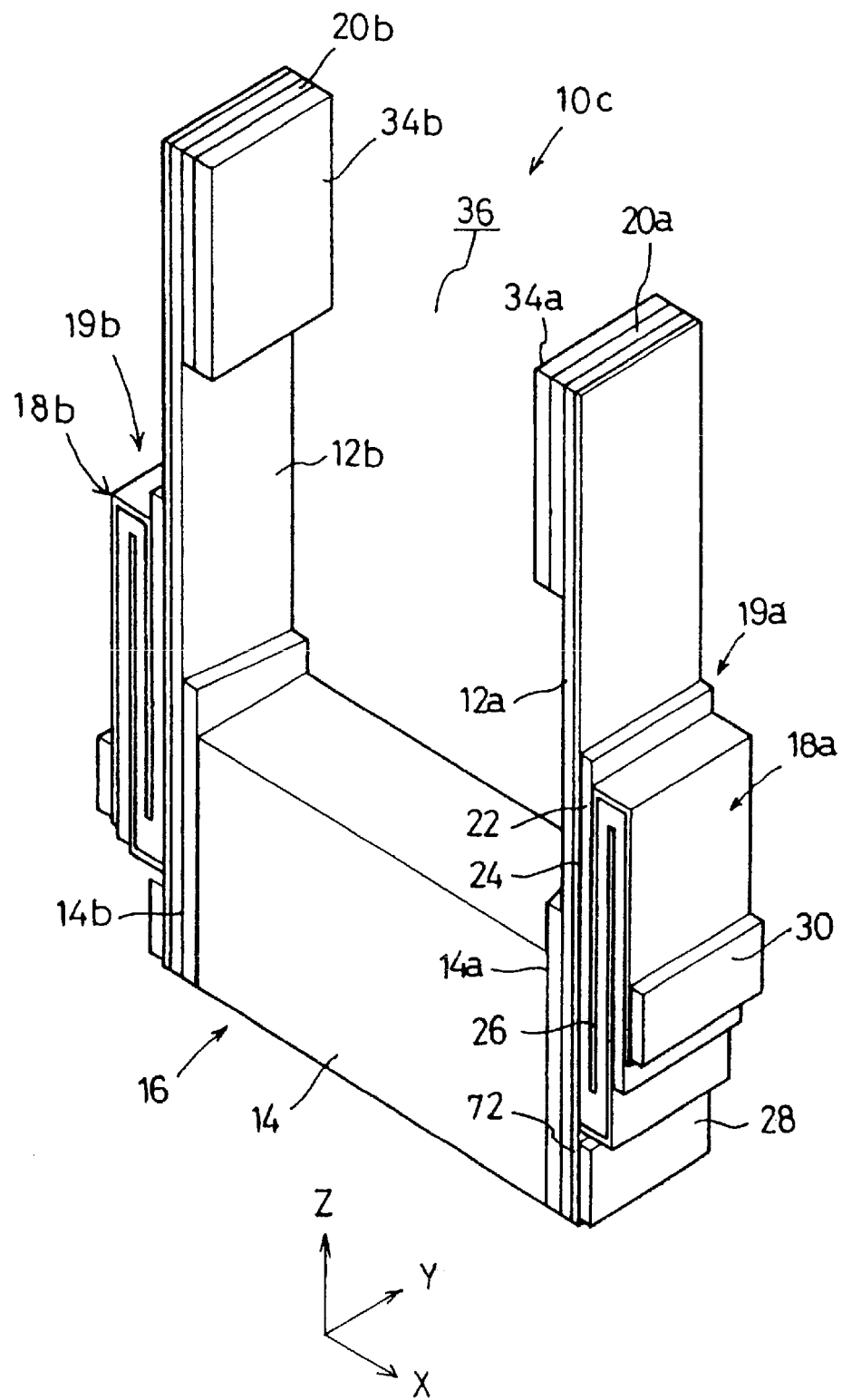
FIG. 8 is a perspective view showing a piezo-electric/electrostrictive device having a recess of another type.

In the piezo-electric/electrostrictive device 10*c* according to the fourth embodiment, as shown in FIG. 8, the filler having a substantially uniform thickness is provided in the recess between the thin plate section, and the movable section and the fixing section. Such a filler is preferably formed at the same time that the thin plate sections are integrally formed with the movable section and the fixing section using ceramics as a material. The preferable material of the filler is a mixture of ceramics and high-melting point metal or high-melting point metal.

Next, the method for producing the piezo-electric/electrostrictive device 10 will be described referring to FIGS. 9 to 12.

The piezo-electric/electrostrictive device 10 includes constituent elements preferably made of ceramics. Among the constituent elements, the substrate 16 (except for the piezo-electric/electrostrictive elements 18*a* and 18*b*), the thin plate sections 12*a* and 12*b*, the fixing section 14, and the movable sections 20*a* and 20*b* are preferably produced by a ceramic green sheet laminating method. On the other hand, the piezo-electric/electrostrictive elements 18*a* and 18*b*, and the terminals 28 and 30 are preferably made by a film formation method such as that employed for forming thin films and thick films.

In a ceramic green sheet laminating method capable of integrally forming the members of the substrate 16 of the piezo-electric/electrostrictive device 10, there arises almost no change in the state of connections between the members with the elapse of time. Therefore, this method is advantageous to attain high reliability at the connections between the members and has high rigidity.

In addition, the production method described below is excellent in productivity and formability. Therefore, the piezo-electric/electrostrictive device 10 can be produced into a predetermined shape with high reproducibility in a short time.

Hereinafter, the first method for producing the piezo-electric/electrostrictive device 10 according to the embodiment of the present invention will be described. Herein, definitions are made as follows. A laminated body obtained by laminating ceramic green sheets on top of each other is defined as a ceramic green sheet 58 (for example, see FIG. 10). The ceramic green laminated body 58 is sintered and integrated into a one-piece unit, and the resultant body is defined as a ceramic laminated body 60. From the ceramic laminated body 60, unnecessary portions are cut off and removed, and the resultant body, including the movable sections 20a and 20b, thin plate sections 12a and 12b, and the fixing section 14 as an integrated one-piece unit is defined as a ceramic substrate 16 (see FIG. 12).

In this production method, a plurality of piezo-electric/electrostrictive devices 10 are arranged on the same substrate in its longitudinal and lateral directions. Finally, the ceramic laminated bodies 60 are cut off by the unit of chip to obtain a plurality of piezo-electric/electrostrictive devices 10 simultaneously in one step. However, in order to simplify the description, the production of only one piezo-electric/electrostrictive device 10 is shown.

First, a binder, a solvent, a dispersant, a plasticizer and the like are added into a ceramic powder, such as zirconia, and mixed to prepare a slurry. The slurry is subjected to degassing, and after that, formed into a ceramic green sheet by a method such as reverse coating or doctor blade.

Figure 9:
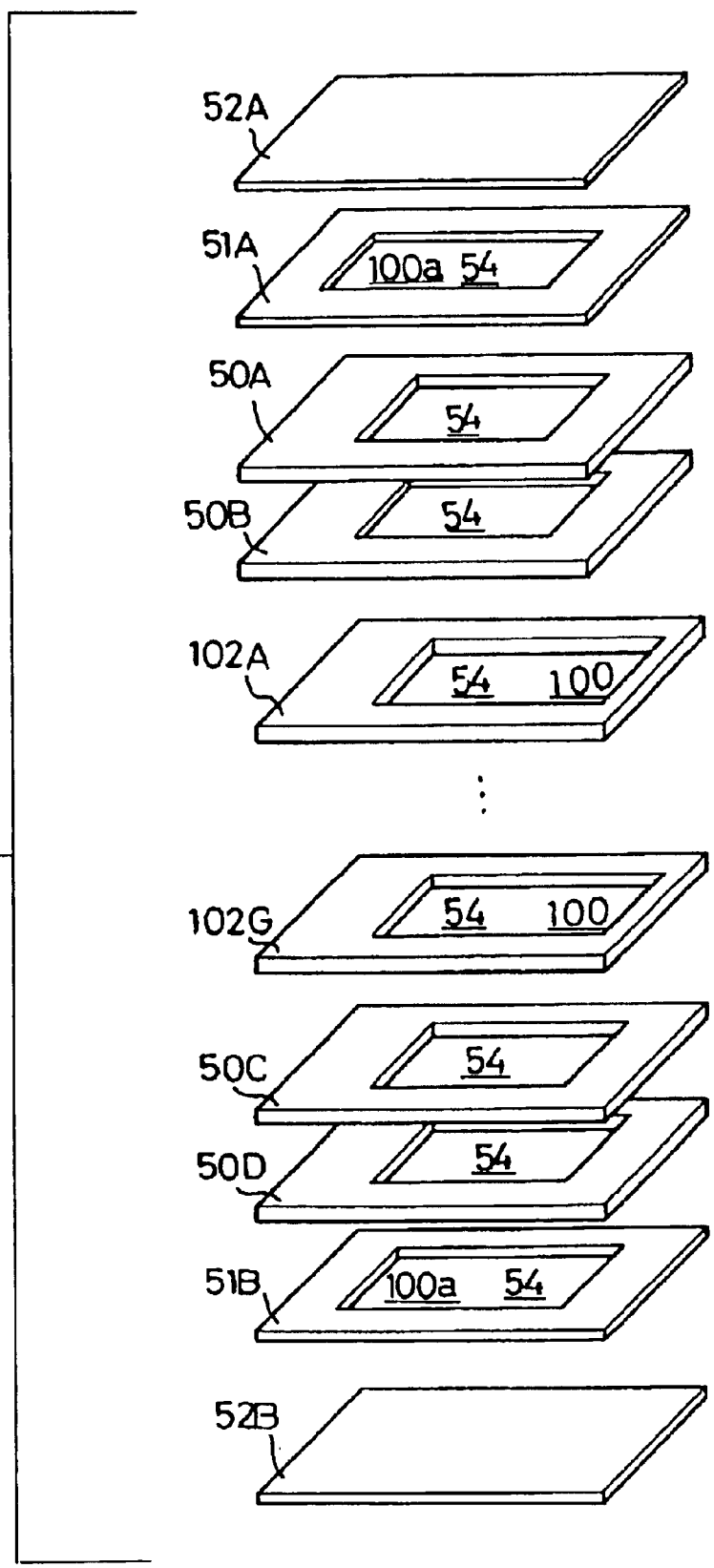
FIG. 9 is an explanatory diagram showing green sheets to be laminated on top of each other.

The ceramic green sheet is processed into various shapes and thicknesses as shown in FIG. 9 by a method such as blanking using a mold and laser processing. As a result, a plurality of ceramic green sheets for forming substrates are obtained.

The details of the prepared ceramics green sheets 50A to 50D, 51A and 51B, 52A and 52B are as follows. A plurality of (for example, four) ceramic green sheets 50A to 50D are formed with a window section 54 for forming the hole section at least between the thin plate sections 12a and 12b. A plurality of (for example, seven) ceramic green sheets 102A to 102G are formed with a window section 54 for forming the hole section between the thin plate sections 12a and 12b, and a window section 100 for forming the movable sections 20a and 20b with the end surfaces 34a and 34b in an opposed relation to each other, and the window sections 54 and 100 are joined into one window section. A plurality of (for example, two) ceramic green sheets 51A and 51B are formed with a window section 100a to be the recesses 14a and 14b. A plurality of (for example, two) ceramic green sheets 52A and 52B to be the thin plate sections 12a and 12b are formed.

Figure 10:
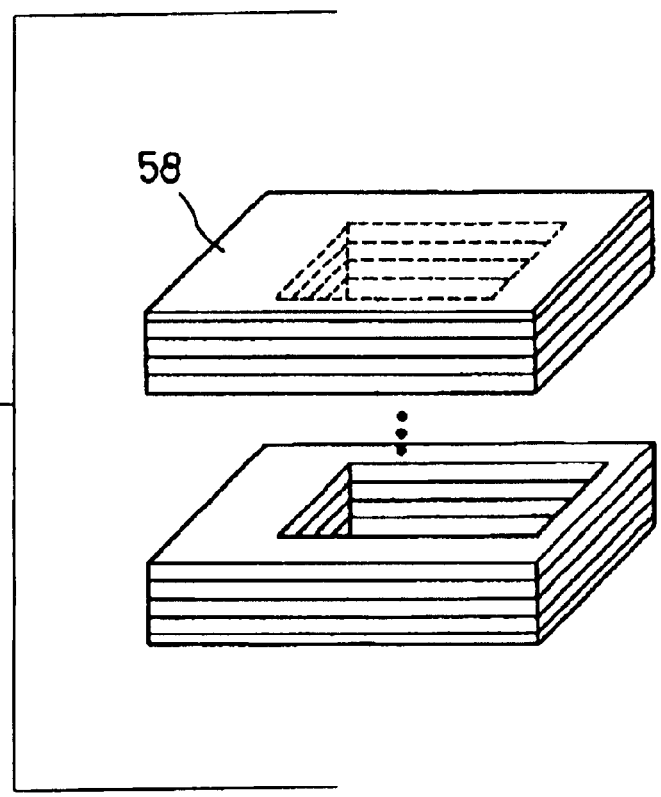
FIG. 10 is an explanatory diagram showing the state where the green sheets are laminated on top of each other.

After that, as shown in FIG. 10, the ceramic green sheets 50A to 50D, 5A and 51B, and 102A to 102G are interposed between the ceramic green sheets 52A and 52B, and then, these ceramics green sheets 50A to 50D, 51A, 51B, 52A and 52B, and 102A to 102G are laminated and crimped to form a ceramic green laminated body 58. In laminating these green sheets, the ceramic green sheets 102A to 102G are positioned at the middle positions. Due to the presence of the window sections 100 and 100a, no pressure is applied to some sections of the green sheets in the step of crimping. In order to prevent sections to which no pressure is applied in the crimping from being created, it is necessary to alter the sequence of lamination and crimping. Then, the ceramic green laminated body 58 is sintered to obtain a ceramic laminated body 60 (see FIG. 11).

The number of times and the sequence of crimping for laminating and integrating the green sheets into a one piece unit are not specifically limited, and may be properly determined so that a ceramics laminated body in a desired structure can be obtained based on the structure of the ceramic green laminated body such as, for example, the shape of the window sections 54 and the number of ceramic green sheets.

It is not necessary that all the window sections 54 have the same shape each other, and their shapes may be determined in accordance with a desired function. In addition, the number of ceramic green sheets and the thickness of each green sheet are not specifically limited.

By crimping the ceramic green sheets through the application of heat, they can be more firmly laminated. The lamination at the interfaces between the ceramic green sheets can be enhanced by applying ceramics powder (it is preferable that this ceramics powder has a composition same or similar to the ceramics used as a material of the ceramic green sheets in order to attain high reliability), a paste containing a binder as a main component, slurry and the like. When the ceramic green sheets 52A and 52B are thin, it is preferable to handle them using a plastic film, especially a polyethylene terephthalate film on which a silicone-based releasing agent is applied.

Figure 11:
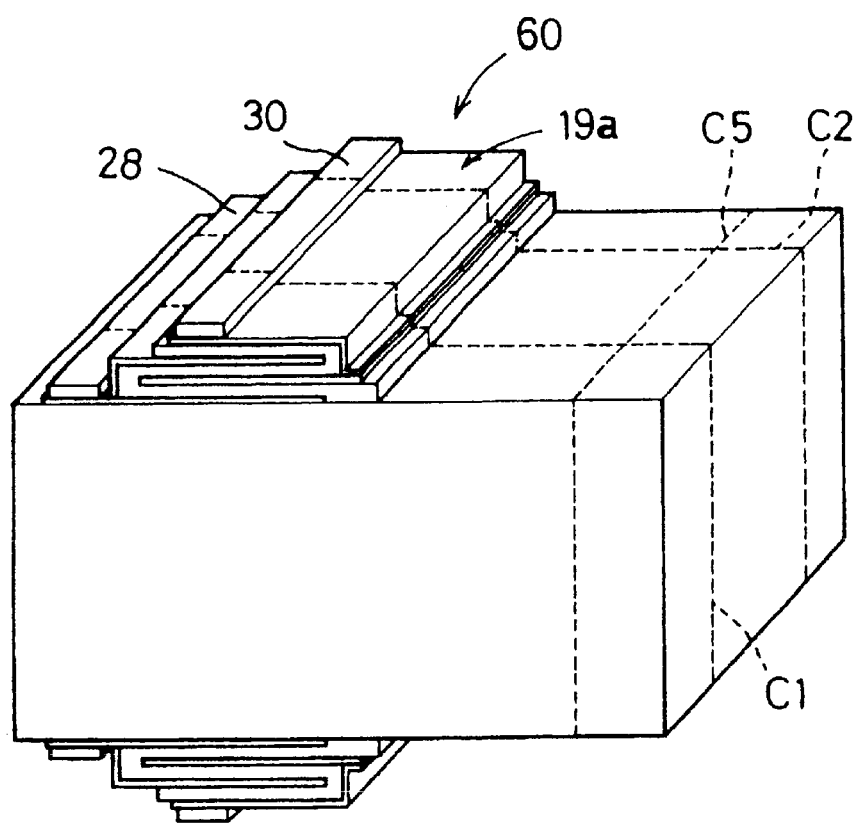
FIG. 11 is an explanatory diagram showing the state after the piezo-electric layer is formed.

Next, as shown in FIG. 11, piezo-electric/electrostrictive elements 18a and 18b are formed on both surfaces of the ceramic laminated body 60, that is, on the surfaces corresponding to the surfaces on which the ceramic green sheets 52A and 52B are laminated. As a method for forming the piezo-electric/electrostrictive elements 18a and 18b, thick film formation methods such as screen printing, dipping, coating, and electrophoresis, and thin film forming methods such as ion beam, sputtering, vacuum deposition, ion plating, chemical vapor deposit (CVD), and plating may be employed.

By employing the film formation method as described above, the piezo-electric/electrostrictive elements 18a and 18b are integrally formed with the thin plate sections 12a and 12b without using an adhesive. As a result, high reliability and high reproducibility are attained, and the piezo-electric/electrostrictive elements 18a and 18b can easily be integrally formed with the thin plate sections 12a and 12b.

In this case, it is preferable to employ the thick film formation method for forming the piezo-electric/electrostrictive elements 18a and 18b. The thick film formation method is especially advantageous in forming the piezo-electric/electrostrictive layer 22. In this case, a green sheet can be formed using a paste, slurry, suspension, or emulsion containing piezo-electric ceramic particles and powder having an average particle diameter of 0.01 to 5 $\mu$m, and preferably 0.05 to 3 $\mu$m. By sintering the green sheet, a layer with excellent piezo-electric/electrostrictive characteristics can be obtained.

The electrophoresis is advantageous in that it forms a layer with high density and high shape precision. Screen printing provides simultaneous film formation and pattern formation, and is therefore advantageous in simplifying production.

The formation of the piezo-electric/electrostrictive elements 18a and 18b will be specifically described. First, the ceramic green laminated body 58 is sintered and integrated at a temperature of 1200 to 1600° C. to obtain the ceramic laminated body 60. Next, the first electrode 24 of the thin plate sections 12a and 12b is printed at a predetermined position on both surfaces of the ceramic laminated body 60, and then is sintered. Then, the piezo-electric/electrostrictive layer 22 is printed and is sintered. After that, the other electrode 26 which pairs up with the electrode 24, is printed and sintered. These steps are repeated a predetermined number of times (if the piezo-electric/electrostrictive elements 18a and 18b are constituted by a multilayered piezo-electric/electrostrictive layer 22), and as a result, the piezo-electric/electrostrictive elements 18a and 18b are formed. After that, terminals 28 and 30 for electrically connecting the electrodes 24 and 26 to the driving circuit are printed and sintered.

Alternatively, the first electrodes 24 in the bottom layer are printed and sintered. Then, the piezo-electric/electrostrictive layer 22, and the other electrode 26 which pairs up with the electrode 24 is printed and sintered. The printing and sintering steps are repeated in this order in predetermined number of times to obtain the piezo-electric/electrostrictive elements 18a and 18b.

By selecting the materials of members in such a manner that the sintering temperatures become gradually lower in accordance with the order of lamination, for example, platinum(Pt) for the electrode 24, lead zirconate titanate (PZT) for the piezo-electric/electrostrictive layer 22, gold (Au) for the electrode 26, and silver (Ag) for the terminals 28 and 30, the material which has been already sintered is not sintered again at a certain sintering stage. In this manner, troubles such as peeling and coagulation of the electrode materials and the like can be avoided.

It is also possible to sequentially print the members of the piezo-electric/electrostrictive elements 18a and 18b and the terminals 28 and 30, and to sinter and integrate them at a time by selecting proper materials. In addition, after forming the piezo-electric/electrostrictive layer 22, which is the outermost layer, the electrode 26 on the outermost layer can be formed at a low temperature.

The members of the piezo-electric/electrostrictive elements 18a and 18b, and the terminals 28 and 30, may be formed by a thin film formation method such as sputtering and deposition. In this case, heat treatment is not necessarily conducted.

In the formation of the piezo-electric/electrostrictive elements 18a and 18b, it is also preferred that the piezo-electric/electrostrictive elements 18a and 18b are formed beforehand on both surfaces of the ceramic green laminated body 58, that is, on the surfaces of the ceramic green sheets 52A and 52B, and the ceramic green laminated body 58 and the piezo-electric/electrostrictive elements 18a and 18b are simultaneously sintered. As to the simultaneous sintering, all the films constituting the ceramic green laminated body 58 and the piezo-electric/electrostrictive elements 18a and 18b may be sintered. It is also possible to simultaneously sinter the electrodes 24 and the ceramic green laminated body 58, or to simultaneously sinter all the film constituting the members except for the electrode 26 and the ceramic green laminated body 58.

The piezo-electric/electrostrictive elements 18a and 18b and the ceramic green laminate body 58 may be simultaneously sintered by the following steps. First, a precursor of the piezo-electric/electrostrictive layer 22 is formed by a tape forming method using a slurry raw material. The precursor of the piezo-electric/electrostrictive layer 22 before sintering is laminated on the surface of the ceramic green laminated body 58 by a method such as heat deposition, and at the same time, is sintered to simultaneously form the movable sections 20a and 20b, the thin plate sections 12a and 12b, the piezo-electric/electrostrictive layer 22, and the fixing section 14. In this method, however, it is necessary to form the electrode 24 on the surface of the ceramic green laminated body 58 and/or the piezo-electric/electrostrictive layer 22 beforehand.

Alternatively, different steps from the above may be employed for simultaneously sintering the piezo-electric/electrostrictive elements 18a and 18b and the ceramic green laminate body 58. That is, the electrodes 24 and 26, and piezo-electric/electrostrictive layer 22, which are constituent elements of the piezo-electric/electrostrictive elements 18a and 18b, are formed on the ceramic green laminated body 58 at the positions which are finally the thin plate sections 12a and 12b, and are sintered simultaneously.

The temperature employed for sintering the constituent elements of the piezo-electric/electrostrictive elements 18a and 18b is determined in accordance with the material of the constituent elements. In general, the temperature is 500 to 1500° C., and as to the piezo-electric/electrostrictive layer 22, preferably 1000 to 1400° C. In this case, in order to control the composition of the piezo-electric/electrostrictive layer 22, the material thereof is preferably calcined in the presence of the evaporation source. When the piezo-electric/electrostrictive layer 22 and the ceramic green laminated body 58 are sintered simultaneously, it is necessary to sinter them under the same conditions. The piezo-electric/electrostrictive elements 18a and 18b are not necessarily formed on both surfaces of the ceramic laminated body 60 or the ceramic green laminated body 58, and may be formed only one of the surfaces thereof.

Figure 12:
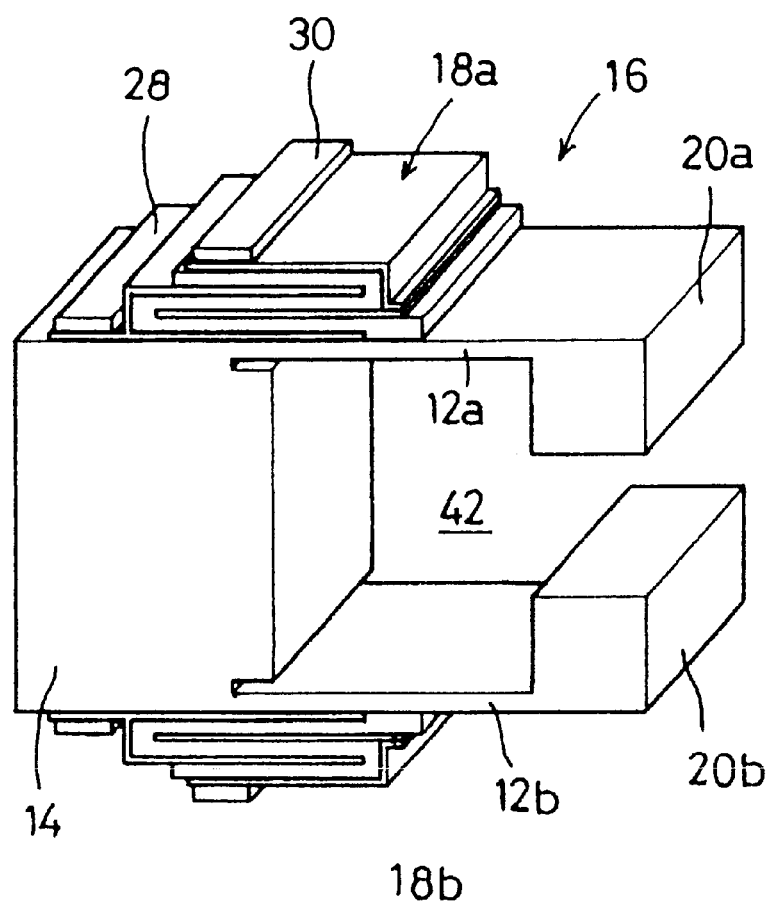
FIG. 12 is an explanatory diagram showing piezo-electric/electrostrictive device after cutting.

Next, the ceramic laminated body 60 on which the piezo-electric/electrostrictive elements 18a and 18b are formed is cut along the cutting lines C1, C2, and C5 to remove the side portions and the top ends of the ceramic laminated body 60. By cutting the ceramic laminated body 60, as shown in FIG. 12, the piezo-electric/electrostrictive device 10 is obtained where the ceramic substrate 16 includes the piezo-electric/electrostrictive elements 18a and 18b, and movable sections 20a and 20b having the end surfaces 34a and 34b in an opposed relation to each other. The ceramic laminated body 60 may be cut along the line C1 and C2 first, and then, along the line C5, or may be cut along the cutting line C5, and then, along the lines C1 and C2. It is also possible that the ceramic laminated body 60 may be cut along the cutting lines C1, C2, and C5 simultaneously. The end surface of the fixing section 14 in an opposed relation to the cutting line C5 may be properly cut when, for example, the entire length of the piezo-electric/electrostrictive device is precisely controlled.

In the production method described above, unnecessary portions are cut and removed from the ceramic laminated body 60. The obtained piezo-electric/electrostrictive device 10 includes the piezo-electric/electrostrictive elements 18a and 18b on the ceramic substrate 16, and the movable sections 20a and 20b having the end surfaces 34a and 34b. In this method, the production steps can be simplified, and the yield of the piezo-electric/electrostrictive device 10 can be increased. It is especially preferable that a plurality of piezo-electric/electrostrictive devices 10 are arranged on the same substrate in its longitudinal and lateral directions respectively to obtain a plurality of devices in one step.

The ceramic laminated body may be cut by mechanical processings such as dicing and wire saw processing, laser processing with YAG laser, excimer laser, electron beam and the like.

When the ceramic substrate 16 is cut, the above-described processings are employed in combination. It is preferable, for example, wire saw processing is employed for cutting along the lines C1 and C2 (see FIG. 11), and dicing is employed for cutting the fixing sections 14 perpendicular to the cutting lines C1 and C2, and the end surface of movable sections 20a and 20b.

In the above-described method for producing the piezo-electric/electrostrictive device 10, the piezo-electric/electrostrictive elements 18a and 18b are formed on the thin plate sections 12a and 12b by sintering and integrating them into a one-piece unit. The thin plate sections 12a and 12b, and the piezo-electric/electrostrictive elements 18a and 18b are slightly displaced to project toward the hole section 42, and become deformed due to the shrinkage of the piezo-electric/electrostrictive layer 22, and the difference in thermal coefficients between the pair of electrodes 24 and 26 and the thin plate sections 12a and 12b. As a result, internal residue stress tends to be generated in the piezo-electric/electrostrictive elements 18a and 18b (and especially piezo-electric/electrostrictive layer 22) and the thin plate sections 12a and 12b.

The internal residue stress is also generated in the thin plate sections 12a and 12b, and the piezo-electric/electrostrictive layer 22 when the piezo-electric/electrostrictive elements 18a and 18b are attached to the thin plate sections 12a and 12b as separated members, besides in the integration by sintering described above. That is, when the adhesive is stabilized or cured, the adhesive shrinks on curing to cause the internal residue stress to generate in the thin plate sections 12a and 12b, and the piezo-electric/electrostrictive layer 22. Furthermore, if the adhesive requires heat application at the time of stabilization or curing, larger internal residue stress is generated.

If the piezo-electric/electrostrictive device 10 is used in this state, there are cases where the movable sections 20a and 20b do not exhibit a desired amount of displacement even if a specified electric field is applied to the piezo-electric/electrostrictive layer 22. This is because the internal residue stress generated in the thin plate sections 12a and 12b, and the piezo-electric/electrostrictive layer 22 damages the material characteristics of the piezo-electric/electrostrictive layer 22, and impedes the displacement movement of the movable sections 20a and 20b.

In order to avoid such trouble, in the production method of the present invention, the peripheral portions of the movable sections 20a and 20b are cut and removed after the piezo-electric/electrostrictive elements 18a and 18b are formed. As a result of cutting, the end surfaces 34a and 34b in an opposed relation to each other are formed on the movable sections 20a and 20b respectively. The end surfaces 34a and 34b moves in a direction that they get close to each other by the internal residue stress generated in the thin plate sections 12a and 12b, and the piezo-electric/electrostrictive layer 22. The width between the end surfaces 34a and 34b after they get close to each other becomes a second specified width W2 which is shorter than the specified width W1. More specifically, the second specified width W2 does not extend straightly, but gradually decreases in an upward direction and is smaller at the top ends of the end surfaces 34a and 34b than the bottom ends thereof.

The end surfaces 34a and 34b move when the internal residue stress is generated in the thin plate sections 12a and 12b, and the piezo-electric/electrostrictive layer 22 is released. If the piezo-electric/electrostrictive device 10 is used in the state where the internal residue stress is released, the movable sections 20a and 20b exhibit the displacement movement substantially as designed, and as a result, the device 10 exhibits excellent characteristics. The same effect can be obtained in the case where the end surfaces 34a and 34b in an opposed relation to each other are formed in the fixing section 14 by cutting a part of the portion to be the fixing section 14. In this case, the internal stress generated in the thin plate sections 12a and 12b, and the piezo-electric/electrostrictive layer 22 is released by the movement of the end surfaces 34a and 34b in an opposed relation to each other formed in the fixing section 14. The end surfaces 34a and 34b are not necessarily formed at a middle area of the movable sections 20a and 20b or the fixing section 14, and the same effect can be obtained when they are formed at positions depart from the middle area.

In the cutting step shown in FIG. 11, the ceramic laminated body after being cut is preferably heated at 300 to 800° C. for the following reason. As a result of the cutting process, defects, such as micro cracks, tend to be created in the piezo-electric/electrostrictive device 10. These defects can be reduced by being heated, and high reliability can be attained. After the heat treatment, the ceramic laminated body is subjected to an aging treatment where it is held at about 80° C. for at least 10 hours. In the aging treatment, various stresses received in the production steps can be further decreased thereby increasing the characteristics of the device.

As described above, according to the present invention, a recess filled with a filler is present between at least the thin plate section and movable section, or between the thin plate section and the fixing section. With this arrangement, even if the thin plate sections create large displacement by receiving a large impact from the outside, and stress is generated at a boundary between the thin plate section and the movable section or between the thin plate section and the fixing section, the stress is dispersed into the filler provided in the recess. In this manner, there is no damage which has conventionally resulted from the concentration of stress, and there is only a small influence to the basic properties of the piezo-electric/electrostrictive device. As a result, the impact resistance of the thin plate sections is enhanced.

We claim:

1. A method for producing a piezoelectric/electrostrictive device comprising a pair of opposed thin plate sections having a movable section at one end thereof, a fixing section supporting said thin plate sections, and at least one piezoelectric/electrostrictive element formed on at least one of said thin plate sections, said method comprising the steps of:

providing a first ceramic green sheet for a thin plate section;

providing a second ceramic green sheet having a first window section;

providing a third ceramic green sheet having a second window section, said second window section being smaller than said first window section;

interposing said second ceramic green sheet between said first ceramic green sheet and said third ceramic green sheet to form a laminated green ceramic body such that said first ceramic green sheet defines a portion of an outer surface of said laminated green ceramic body;

sintering said laminated green ceramic body to form a laminated sintered ceramic body;

forming at least one piezoelectric/electrostrictive element on a portion of said outer surface of said laminated green ceramic body or on an outer surface of said laminated sintered ceramic body; and cutting said laminated sintered ceramic body and removing unnecessary portions to form said piezoelectric/electrostrictive device.

2. The method of claim 1, further comprising the steps of:
providing another first ceramic green sheet;
providing another second ceramic green sheet;
providing another third ceramic green sheet;
interposing said another third ceramic green sheet between said third ceramic green sheet and said another second ceramic green sheet; and
interposing said another second ceramic green sheet between said another third ceramic green sheet and said another first ceramic green sheet such that said another first ceramic green sheet defines another portion of said outer surface of said laminated green ceramic body.

3. A method for producing a piezoelectric/electrostrictive device comprising a pair of opposed thin plate sections having a movable section at one end thereof, a fixing section supporting said thin plate sections, and at least one piezoelectric/electrostrictive element formed on at least one of said thin plate sections, said method comprising the steps of:
providing a first ceramic green sheet for a thin plate section;
providing at least one of a second ceramic green sheet having a window section formed therein;
providing a high melting point metal sheet;
forming a laminated green ceramic body by interposing said high melting point metal sheet between said first ceramic green sheet and said second ceramic green sheet such that said high melting point metal sheet directly contacts said first ceramic green sheet and said second ceramic green sheet, such that said high melting point metal sheet is present between said fixing section and said thin plate section as well as between said thin plate section and said moveable section, and such that said first ceramic green sheet defines a portion of an outer surface of said laminated green ceramic body;
sintering said laminated green ceramic body to form a laminated sintered ceramic body;
forming at least one piezoelectric/electrostrictive element on a portion of said outer surface of said laminated green ceramic body or on a portion of an outer surface of said laminated sintered ceramic body; and
cutting said laminated sintered ceramic body and removing unnecessary portions to form said piezoelectric/electrostrictive device.

4. The method of claim 3, wherein said high melting point metal sheet is formed by a printing method.

5. The method of claim 3, further comprising the steps of:
providing another first ceramic green sheet for a thin plate section:
providing another second ceramic green sheet;
providing another high melting point metal sheet;
interposing said another said high melting point metal sheet between said another second ceramic green sheet and said another first ceramic green sheet; and
interposing said another second ceramic green sheet between said second ceramic green sheet and said another high melting point metal sheet such that said another high melting point metal sheet directly contacts said another first ceramic green sheet and said another second ceramic green sheet, such that said another high melting point metal sheet is present between said fixing section and said thin plate section as well as between said thin plate section and said moveable section, and such that said another first ceramic green sheet defines a portion of said outer surface of said laminated green ceramic body.

6. A method for producing a piezoelectric/electrostrictive device comprising a pair of opposed thin plate sections having a movable section at one end thereof, a fixing section supporting said thin plate sections, and at least one piezoelectric/electrostrictive element formed on at least one of said thin plate sections, said method comprising the steps of:
providing a first ceramic green sheet for a thin plate section;
providing a second ceramic green sheet having a first window section, wherein a portion of said first window defines at least a portion of a slit in said piezoelectric/electrostrictive device;
providing a third ceramic green sheet having a second window section, said second window section being smaller than said first window section;
interposing said second ceramic green sheet between said first ceramic green sheet and said third ceramic green sheet to form a laminated green ceramic body such that said first ceramic green sheet defines a portion of an outer surface of said laminated green ceramic body;
sintering said laminated green ceramic body to form a laminated sintered ceramic body;
forming at least one piezoelectric/electrostrictive element on a portion of said outer surface of said laminated green ceramic body or on a portion of an outer surface of said laminated sintered ceramic body;
cutting said laminated sintered ceramic body and removing unnecessary portions to expose said slit; and
providing a filler material in said slit.

7. The method of claim 6, wherein said filler material comprises a resin.

8. A method for producing a piezoelectric/electrostrictive device comprising a pair of opposed thin plate sections having a movable section at one end thereof, a fixing section supporting said thin plate sections, and at least one piezoelectric/electrostrictive element formed on at least one of said thin plate sections, said method comprising the steps of:
providing a first ceramic green sheet for a thin plate section;
providing a second ceramic green sheet having a first window section, wherein a portion of said first window section defines at least a portion of a slit in said piezoelectric/electrostrictive device;
providing a filler material at least in said portion of said first window section defining said slit;
providing a third ceramic green sheet having a second window section, said second window section being smaller than said first window section;
interposing said second ceramic green sheet between said first ceramic green sheet and said third ceramic green sheet to form a laminated green ceramic body such that said first ceramic green sheet defines a portion of an outer surface of said laminated green ceramic body;
sintering said laminated green ceramic body to form a laminated sintered ceramic body;
forming at least one piezoelectric/electrostrictive element on a portion of said outer surface of said laminated green ceramic body or on a portion of an outer surface of said laminated sintered ceramic body; and
cutting said laminated sintered ceramic body and removing unnecessary portions to form said piezoelectric/electrostrictive device.

* * * * *